(12) United States Patent  (10) Patent No.: US 9,035,673 B2
Young et al.  (45) Date of Patent: May 19, 2015

(54) METHOD OF IN-PROCESS INTRALAYER YIELD DETECTION, INTERLAYER SHUNT DETECTION AND CORRECTION

(75) Inventors: Michael Yu Tak Young, Cupertino, CA (US); Scott Jong Ho Limb, Palo Alto, CA (US); William S. Wong, San Carlos, CA (US); Robert A. Street, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1486 days.

(21) Appl. No.: 12/693,019

(22) Filed: Jan. 25, 2010

(65) Prior Publication Data

US 2011/0185322 A1 Jul. 28, 2011

(51) Int. Cl.
| | | |
|---|---|---|
| G01R 31/14 | (2006.01) | |
| G11C 29/02 | (2006.01) | |
| G01R 31/28 | (2006.01) | |
| H01L 21/66 | (2006.01) | |
| G11C 29/04 | (2006.01) | |

(52) U.S. Cl.
CPC .......... *G11C 29/025* (2013.01); *G01R 31/2853* (2013.01); *G11C 2029/0403* (2013.01); *H01L 22/14* (2013.01); *H01L 22/20* (2013.01)

(58) Field of Classification Search
USPC ................ 324/522, 525, 519, 713, 750.01, 324/750.24, 760.01, 760
See application file for complete search history.

(56) References Cited

U.S. PATENT DOCUMENTS

| | | | |
|---|---|---|---|
| 4,862,075 A | 8/1989 | Choi et al. | |
| 4,875,006 A | 10/1989 | Henley et al. | |
| 4,983,911 A | 1/1991 | Henley | |
| 5,073,754 A | 12/1991 | Henley | |
| 5,081,687 A | 1/1992 | Henley et al. | |
| 5,095,262 A | 3/1992 | Henley et al. | |
| 5,097,201 A | 3/1992 | Henley | |
| 5,124,635 A | 6/1992 | Henley | |
| 5,157,327 A | 10/1992 | Henley | |
| 5,164,565 A | 11/1992 | Addiego et al. | |
| 5,170,127 A | 12/1992 | Henley | |
| 5,175,504 A | 12/1992 | Henley | |
| 5,177,437 A | 1/1993 | Henley | |
| 5,212,374 A | 5/1993 | Speedy et al. | |
| 5,235,272 A | 8/1993 | Henley | |
| 5,285,150 A | 2/1994 | Henley et al. | |
| 5,311,111 A | 5/1994 | Karpol et al. | |
| 5,328,811 A | 7/1994 | Brestel | |
| 5,333,052 A | 7/1994 | Finarov | |
| 5,357,194 A | 10/1994 | Ullman et al. | |
| 5,359,206 A | 10/1994 | Yamamoto et al. | |

(Continued)

OTHER PUBLICATIONS

"The Ultimate Probing Machine", http://www.acculogic.com, Acculogic Inc., 1992-2009.

(Continued)

*Primary Examiner* — Vincent Q Nguyen

(74) *Attorney, Agent, or Firm* — Fay Sharpe LLP

(57) ABSTRACT

A system and method for in-process yield evaluation and correction in an array type of device are provided. The system and method include measuring electrical resistance between individual GATE lines, DATA lines, a DATA bus I/O pad, and a GATE bus I/O pad; and analyzing the measured electrical resistance to identify at least one of the following: GATE line open defects, GATE line bridge defects, DATA line open defects, DATA line bridge defects, and interlayer shunt defects.

30 Claims, 21 Drawing Sheets

(56) References Cited

U.S. PATENT DOCUMENTS

| | | | |
|---|---|---|---|
| 5,363,037 A | 11/1994 | Henley et al. | |
| 5,369,431 A | 11/1994 | Levy et al. | |
| 5,374,021 A | 12/1994 | Kleinman | |
| 5,387,788 A | 2/1995 | Miller et al. | |
| 5,391,985 A | 2/1995 | Henley | |
| 5,406,213 A | 4/1995 | Henley | |
| 5,432,461 A | 7/1995 | Henley | |
| 5,444,385 A | 8/1995 | Henley | |
| 5,450,201 A | 9/1995 | Katzir et al. | |
| 5,459,409 A | 10/1995 | Henley | |
| 5,459,410 A | 10/1995 | Henley | |
| 5,465,052 A | 11/1995 | Henley | |
| 5,495,535 A | 2/1996 | Smilansky et al. | |
| 5,504,438 A | 4/1996 | Henley | |
| 5,543,729 A | 8/1996 | Henley | |
| 5,570,011 A | 10/1996 | Henley | |
| 5,585,290 A | 12/1996 | Yamamoto et al. | |
| 5,615,039 A | 3/1997 | Henley | |
| 5,625,403 A | 4/1997 | Hazman | |
| 5,631,733 A | 5/1997 | Henley | |
| 5,650,834 A | 7/1997 | Nakagawa et al. | |
| 5,672,523 A | 9/1997 | Yamamoto et al. | |
| 5,754,678 A | 5/1998 | Hawthorne et al. | |
| 5,764,209 A | 6/1998 | Hawthorne et al. | |
| 5,774,572 A | 6/1998 | Caspi et al. | |
| 5,774,573 A | 6/1998 | Caspi et al. | |
| 5,790,247 A | 8/1998 | Henley et al. | |
| 5,801,824 A | 9/1998 | Henley | |
| 5,889,573 A | 3/1999 | Yamamoto et al. | |
| 5,917,935 A | 6/1999 | Hawthorne et al. | |
| 6,037,965 A | 3/2000 | Gross et al. | |
| 6,054,235 A | 4/2000 | Bryan et al. | |
| 6,145,648 A | 11/2000 | Teichman et al. | |
| 6,151,153 A | 11/2000 | Bryan | |
| 6,154,561 A | 11/2000 | Pratt et al. | |
| 6,211,991 B1 | 4/2001 | Bryan | |
| 6,215,895 B1 | 4/2001 | Sali et al. | |
| 6,223,880 B1 | 5/2001 | Caspi et al. | |
| 6,275,514 B1 | 8/2001 | Katzir et al. | |
| 6,367,609 B2 | 4/2002 | Caspi et al. | |
| 6,408,260 B1 | 6/2002 | Watts et al. | |
| 6,419,148 B1 | 7/2002 | Waxler | |
| 6,437,312 B1 | 8/2002 | Adler et al. | |
| 6,437,357 B1 | 8/2002 | Weiss et al. | |
| RE37,847 E | 9/2002 | Henley et al. | |
| 6,485,176 B1 | 11/2002 | Chen et al. | |
| 6,501,546 B1 | 12/2002 | Weiss | |
| 6,512,239 B1 | 1/2003 | Weiss et al. | |
| 6,556,293 B2 | 4/2003 | Savareigo | |
| 6,621,572 B2 | 9/2003 | Savareigo | |
| 6,630,832 B1 | 10/2003 | Harzaru et al. | |
| 6,654,115 B2 | 11/2003 | Zemer et al. | |
| 6,656,374 B2 | 12/2003 | Savareigo | |
| 6,675,120 B2 | 1/2004 | Pratt et al. | |
| 6,689,985 B2 | 2/2004 | Lipman et al. | |
| 6,701,197 B2 | 3/2004 | Ben-Ezra et al. | |
| 6,736,588 B1 | 5/2004 | Baldwin et al. | |
| 6,756,563 B2 | 6/2004 | Gross et al. | |
| 6,757,645 B2 | 6/2004 | Chang et al. | |
| 6,759,850 B2 | 7/2004 | Harzanu et al. | |
| 6,765,934 B2 | 7/2004 | Gross | |
| 6,781,687 B2 | 8/2004 | Fisch et al. | |
| 6,795,186 B2 | 9/2004 | Aspir et al. | |
| 6,809,290 B2 | 10/2004 | Gross et al. | |
| 6,810,297 B2 | 10/2004 | Adin et al. | |
| 6,819,789 B1 | 11/2004 | Kantor et al. | |
| 6,822,734 B1 | 11/2004 | Eidelman et al. | |
| 6,832,843 B2 | 12/2004 | Adler et al. | |
| 6,834,243 B2 | 12/2004 | Zemer et al. | |
| 6,840,667 B2 | 1/2005 | Schlagheck et al. | |
| 6,847,442 B1 | 1/2005 | Katzir et al. | |
| RE38,716 E | 3/2005 | Caspi et al. | |
| 6,864,498 B2 | 3/2005 | Katzir et al. | |
| 6,866,887 B1 | 3/2005 | Chen et al. | |
| 6,870,611 B2 | 3/2005 | Savareigo et al. | |
| 6,873,747 B2 | 3/2005 | Askary | |
| 6,882,899 B2 | 4/2005 | Baldwin et al. | |
| 6,911,620 B2 | 6/2005 | Lepman et al. | |
| 6,933,013 B2 | 8/2005 | Pethe et al. | |
| 6,946,660 B2 | 9/2005 | El-Hanany et al. | |
| 6,954,678 B1 | 10/2005 | Phan et al. | |
| 6,973,406 B2 | 12/2005 | Zemer et al. | |
| 6,990,227 B2 | 1/2006 | Greenberg et al. | |
| 7,006,612 B1 | 2/2006 | Savareigo et al. | |
| 7,009,163 B2 | 3/2006 | Katzir et al. | |
| 7,041,998 B2 | 5/2006 | Weiss et al. | |
| 7,058,474 B2 | 6/2006 | Ganot et al. | |
| 7,062,354 B2 | 6/2006 | Ganot et al. | |
| 7,064,338 B2 | 6/2006 | El-Hanany et al. | |
| 7,077,019 B2 | 7/2006 | Weiss et al. | |
| 7,078,650 B2 | 7/2006 | Gross et al. | |
| 7,084,970 B2 | 8/2006 | Weiss et al. | |
| 7,092,000 B2 | 8/2006 | Katzir et al. | |
| 7,095,883 B2 | 8/2006 | Safaee-Rad et al. | |
| 7,099,067 B2 | 8/2006 | Chen | |
| 7,107,571 B2 | 9/2006 | Chang | |
| 7,129,509 B2 | 10/2006 | Katzir et al. | |
| 7,137,309 B2 | 11/2006 | Weiss et al. | |
| 7,166,848 B2 | 1/2007 | El-Hanany et al. | |
| 7,170,542 B2 | 1/2007 | Hanina et al. | |
| 7,176,409 B2 | 2/2007 | Gross et al. | |
| 7,177,458 B1 | 2/2007 | Savareigo et al. | |
| 7,180,084 B2 | 2/2007 | Weiss et al. | |
| 7,181,059 B2 | 2/2007 | Duvdevani et al. | |
| 7,200,259 B1 | 4/2007 | Gold et al. | |
| 7,203,355 B2 | 4/2007 | Levi et al. | |
| 7,206,443 B1 | 4/2007 | Duvdevani et al. | |
| 7,208,740 B2 | 4/2007 | El-Hanany et al. | |
| 7,215,417 B2 | 5/2007 | Katzir et al. | |
| 7,218,771 B2 | 5/2007 | Gilat Bernshtein et al. | |
| 7,231,080 B2 | 6/2007 | Hakim et al. | |
| 7,253,120 B2 | 8/2007 | Glazer et al. | |
| 7,253,891 B2 | 8/2007 | Toker et al. | |
| 7,283,660 B2 | 10/2007 | Ganot et al. | |
| 7,295,696 B2 | 11/2007 | Levi et al. | |
| 7,301,133 B2 | 11/2007 | Weiss | |
| 7,308,157 B2 | 12/2007 | Safaee-Rad et al. | |
| 7,317,522 B2 | 1/2008 | Nedivi | |
| 7,326,906 B2 | 2/2008 | Shalom et al. | |
| 7,327,158 B1 | 2/2008 | Jun | |
| 7,330,583 B2 | 2/2008 | Clark et al. | |
| 7,339,176 B2 | 3/2008 | El-Hanany et al. | |
| 7,347,530 B2 | 3/2008 | Miller et al. | |
| 7,355,692 B2 | 4/2008 | Noy et al. | |
| 7,386,161 B2 | 6/2008 | Weiss et al. | |
| 7,388,978 B2 | 6/2008 | Duvdevani et al. | |
| 7,391,510 B2 | 6/2008 | Ben-tulila et al. | |
| 7,417,243 B2 | 8/2008 | Katzir et al. | |
| 7,453,486 B2 | 11/2008 | Katzir et al. | |
| 7,466,161 B2 | 12/2008 | Gardner et al. | |
| 7,468,611 B2 | 12/2008 | Nguyen et al. | |
| 7,479,639 B1 | 1/2009 | Shahar et al. | |
| 7,508,515 B2 | 3/2009 | Hanina et al. | |
| 7,521,651 B2 | 4/2009 | Gross et al. | |
| 7,525,098 B2 | 4/2009 | El-Hanany et al. | |
| 7,528,377 B2 | 5/2009 | El-Hanany et al. | |
| 7,543,867 B2 | 6/2009 | Pun et al. | |
| 2002/0019729 A1 | 2/2002 | Chang et al. | |
| 2002/0034338 A1 | 3/2002 | Askary | |
| 2002/0035461 A1 | 3/2002 | Chang et al. | |
| 2004/0243320 A1 | 12/2004 | Chang et al. | |
| 2008/0308883 A1* | 12/2008 | Hong | 257/412 |
| 2008/0313893 A1* | 12/2008 | Nakasu | 29/830 |

OTHER PUBLICATIONS www.photondynamics.com, Orbotech Inc., 2008 Orbotech Ltd.

* cited by examiner

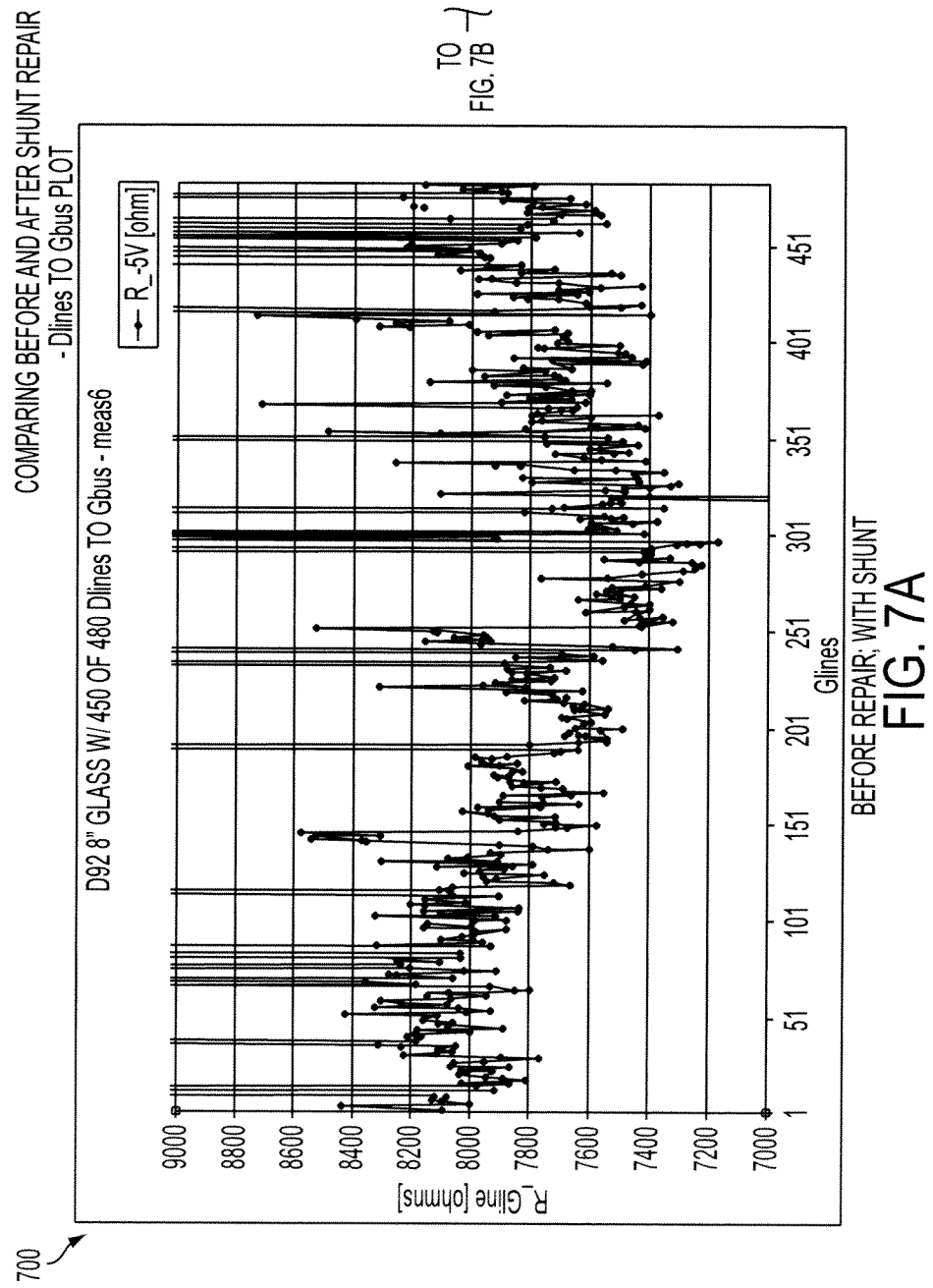

METHOD OF IN-PROCESS INTRALAYER YIELD DETECTION, INTERLAYER SHUNT DETECTION AND CORRECTION

GOVERNMENT CONTRACT

This invention was made with Government Support under Contract Number: 70NANB3H3029 awarded by the National Institute of Standards and Technology. The Government has certain rights in this invention.

BACKGROUND

The present exemplary embodiments relate to in-process intralayer defect detection and correction and interlayer shunt defect detection and correction. It finds particular application to Printed Organic Electronics (POE) arrays, but can be applied to a wide variety of electronic arrays including, for example, liquid crystal displays (LCD), memory arrays (RAM, ROM, etc.), printed circuit boards (PCB), active matrix displays, and passive matrix displays.

With respect to conventional array fabrication processes, forming patterns using traditional photolithographic mask printing methods is highly productive in producing parts that have the exact same pattern over and over again. With this approach, substrate die yield is highly dependent on the absence of process artifacts (i.e. particles etc). If these artifacts cause a line open in the electrical circuitry, repair by localized line reconnection is expensive, tedious, time consuming and may not be practical. Defective dies are usually marked and rejected after die dicing. When die size becomes very large, as in for example, a POE array or a flat panel display (FPD), rejecting such a large die (large real estate) can be very costly. Moreover, bad or poor NSN+ amorphous silicon chemical vapor deposition (CVD) sometimes makes the substrates un-testable as the matrix arrays become non-functional. In particular, process defects due to layer to layer electrical shunts can sometimes disable an entire read out chip making defect isolation and defect locating impossible. The chip, even if working, may produce unreliable results for detection purposes.

Traditionally, electrical evaluation of array matrices has been performed as a final step (as opposed to an in-process step) in the array matrix fabrication process and has been accomplished by contact or non-contact probing of I/O (input and output) pads that have been patterned and defined. A typical array matrix's large physical size can present quite a challenge for such a high I/O test pad connection count to the outside world. For example, most POE arrays have a very large number of DATA and GATE interconnect lines that require testing. In order to manage electrical testing on such a large physical substrate form factor, contact type probe card based testers such as those from Tokyo Cathode Laboratory and flying probe testers such as those from Acculogic have been used. However, these probe testers (or probers) are capital intensive and do not usually fully test the multilevel device matrix. Static multiple probe approaches ("bed of nail" type) have also been used. The apparatus described in U.S. Pat. No. 6,834,243 ("Apparatus and method for electrical testing of electrical circuits") is an example that is suitable for high probe count electrical testing. However these "bed of nail" methods require custom fixturing for each device design and are hence very costly.

An example of a LCD panel final test is illustrated by the LCD evaluation method described in U.S. Pat. No. 5,081,687 and RE37,847. This evaluation method uses a video image capture method to detect FPD matrix electrical opens and shorts by comparing the newly acquired display pattern to a previously captured golden standard sample display image pattern result. For these types of measurement, the FPD is energized through contact type edge shorting bars. This approach is also capital intensive and requires the full process fabrication of the device matrix to the pixel level formation so that the LCD panel can be tested. Another approach for testing POE arrays uses an x-ray imaging system after the formation of the active matrix thin film transistors (TFTs). The x-ray images produced by the imaging system show horizontal and vertical defect lines. However, it is very difficult to quantify the exact cause of such line defects. For example, FIG. 1 shows an image test result 100 from an x-ray detector. As shown, locating the defect via this process can be difficult and time consuming.

Later developed processes utilize peripheral shorting bars and/or short circuit rings. For example, U.S. Pat. No. 7,330,583 ("Integrated visual imaging and electronic sensing inspection systems") utilizes shorting bars to expand the video image capture method to various electronic sensing means such as voltage, e-beam and charge sensing. These shorting bars and/or short circuit rings can be classified into full ring structures or grouped into segmented shorting bar structures. The full ring structures are typically used for static electricity mitigation to protect the array matrix device pixels. An example of this is found in U.S. Pat. No. 5,650,834 ("Active-matrix device having silicide thin film resistor disposed between an input terminal and a short-circuit ring"), where silicided resistors positioned between the edge short circuit ring and the interior array matrix provide static electricity protection for the pixel thin film transistors (TFT).

Another example of an LCD panel final test evaluation is illustrated by Orbotech Ltd.'s evaluation method illustrated in U.S. Pat. No. 5,771,068 ("Apparatus and method for display panel inspection"). This final test evaluation used a full field image sensor to capture and analyze a FPD matrix that was stimulated with various pixel patterns.

Non-contact probing methods have also been used. U.S. Pat. No. 6,630,832 ("Method and apparatus for the electrical testing of printed circuit boards employing intermediate layer grounding") used stimulating and sensing heads and various AC frequencies to probe printed circuit boards (PCBs).

The prior art methods mentioned above apply predominantly to the final stage of testing matrix arrays. Since matrix arrays become a high value added item when fabrication approaches the formation of array pixels, device rejection at this final test stage due to line open, line bridge (i.e. short), and shunt defects becomes very costly. It is thus desirable to have an in-process (or in-fabrication) approach to electrical testing for matrix arrays that is thorough and effective for open, short and shunt defect detection. The exemplary methods and systems utilize a hybrid static peripheral I/O connection method in conjunction with a dynamic probing scheme, an arrangement of sacrificial edge shorting bars (with or without cut lines), and an analytical method to determine defect type and defect locations. For these methods and systems, a previously measured golden standard reference sample result is not required.

BRIEF DESCRIPTION

The presently described embodiments relate to an in-process method of detecting DATA and GATE line defects and an in-process method of detecting shunts between the DATA and GATE layers.

In one aspect, a method and system for in-process yield evaluation and correction in an array type of device are provided. The method and system include measuring an electrical property between individual GATE lines, DATA lines, a DATA bus I/O pad, and a GATE bus I/O pad; and analyzing the measured electrical resistance or capacitance to identify at least one of the following: GATE line open defects, GATE line bridge defects, DATA line open defects, DATA line bridge defects, and interlayer shunt defects.

In another aspect, a method and system for in-process correction of defects in an array type of substrate are provided. The method and system include receiving identified defect types, locations, and process state and dynamically reconfiguring a die or chip design to account for defects on the substrate based at least partially on the received defect types, locations and process state.

BRIEF DESCRIPTION OF THE DRAWINGS

FIGS. 7a and 7b illustrate a data plot of the measured resistance for an array matrix both before and after a shunt repair is performed;

DETAILED DESCRIPTION

Aspects of the present exemplary embodiments relate to a system and method for in-process detection and/or correction of intralayer opens and bridges, and interlayer shunts between metal layers, in an array type of device (such as passive matrix or active matrix) during the manufacturing process. The utilization of electrical measurements and data analysis result in identifying potential defect locations and enabling in-process yield assessment and repairs. The exemplary embodiment, in one form, operates on Printed Organic Electronics (POE) arrays. However, the proposed systems and methods can operate on any electronic array including, for example, printed circuit boards, liquid crystal displays, active matrix displays, passive matrix displays, and memory arrays. Also, the exemplary embodiment, in one form, operates on array design architectures constructed with peripheral bus structures which are particularly suited for in-process detection.

Figure 1:
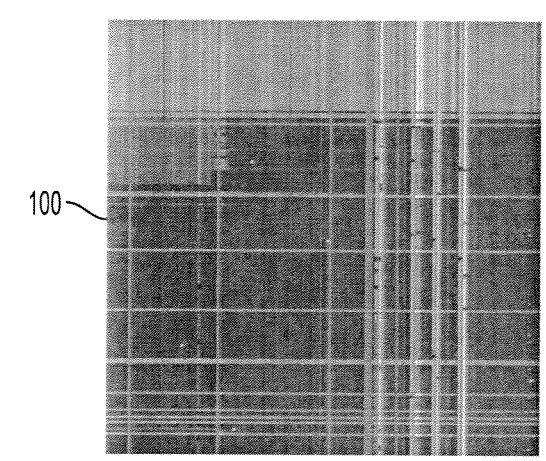
FIG. 1 is an image of a test result from a post-fabrication x-ray detector.
Figure 2:
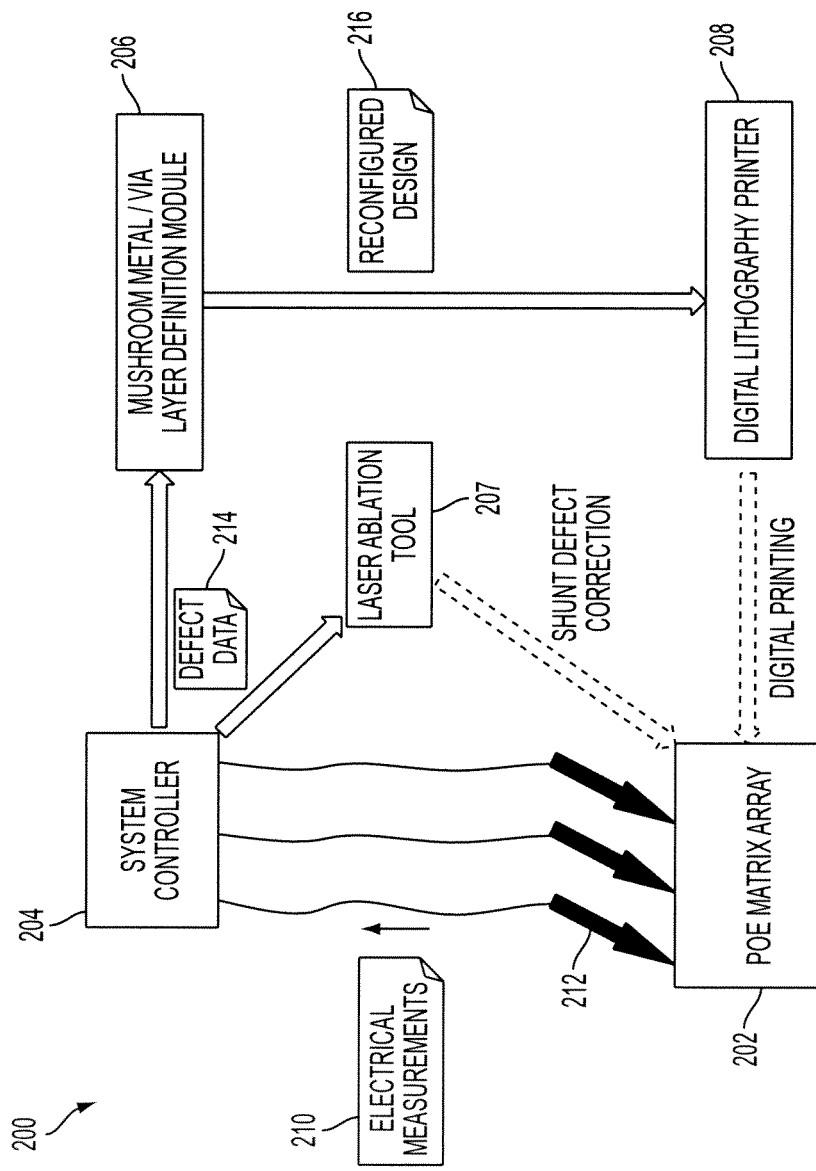
FIG. 2 is a high-level overview of one aspect of the an exemplary system for in-process defect detection and correct for array matrices.

FIG. 2 illustrates an example system under one aspect of an exemplary embodiment. The system 200, for implementation with a POE matrix array 202, includes a system controller 204, an electrical measurement device 212, a mushroom metal/VIA layer definition module 206, a laser ablation tool 207, and a printing system—for printing a digital design on the POE matrix array 202—such as a digital lithography printer 208. In operation, the system controller 204 measures one or more electrical properties 210 (such as resistance or capacitance) of the POE matrix array 202 via electrical probes 212. For example, an electrical property may be measured between the individual GATE/DATA lines and the GATE/DATA pads on the POE matrix array 202. The system controller 204 then analyzes the electrical property data 210 to identify and detect defects 214 and data associated with the defects (such as type, location, and process state) which are then sent to the layer definition module 206 and laser ablation tool 207 for correction. The types of defects that may be detected on the POE matrix array 202 include, for example, GATE line bridge and open defects, DATA line bridge and open defects, and interlayer shunt defects. The laser ablation tool 207 corrects identified shunt defects 214 through a laser ablation process on the POE matrix array 202. Concurrently or sequentially with respect to operation of the laser ablation tool 207, the layer definition module 206 defines a modified mushroom metal and/or via layer 216 for the purpose of correcting the identified defects 214. In essence, the layer definition module 206 is capable of dynamically reconfiguring a die or chip design to account for the received defect data 214. The reconfigured design 216 is downloaded by the digital lithography printer 208 for printing of a subsequent mask layer on the POE matrix array 202.

In one exemplary embodiment, the POE matrix array is mounted onto a stage carrier in preparation for electrical measurements. Electrical measurements of the matrix lines are performed by connecting a probe to the matrix array. For convenience, a standard commercial IC probe station with a probe card may be used to probe the matrix lines. The probe station contains a switching matrix which switches the tension of the testing instrument to each one of the lines, one at a time. This type of probe equipment does not require the purchase of an expensive dedicated system. The parts are available off the shelf.

Additionally, the exemplary embodiments described here measure electrical resistance across the matrix array. However, the exemplary embodiments may measure capacitance or any other electrical property instead of resistance to achieve the desired goals.

Identifying Intra-Layer Line Opens

Figure 3:
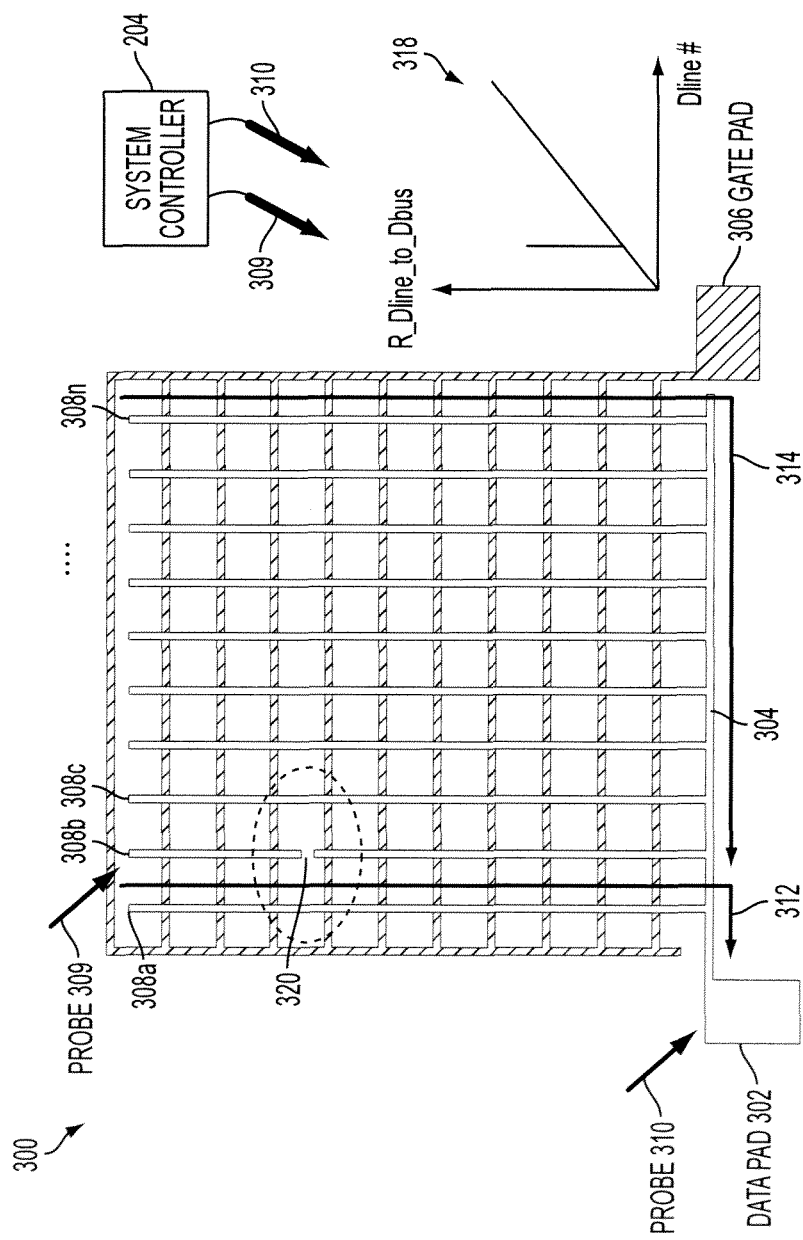
FIG. 3 illustrates how electrical open DATA line data collection measurements are performed for an array matrix.

FIG. 3 illustrates an array matrix 300 having an undesired open circuit 320 therein. As shown, the DATA lines (Dlines) run vertically on the matrix 300 and the GATE lines (Glines) run horizontally. The I/O pad 302 at the lower left corner is the DATA I/O pad for a fixed electrical connection from the common data bus 304 to an external electrical return. Similarly, the I/O pad 306 at the lower right corner is the GATE I/O pad. Electrical resistance is measured from the individual DATA lines 308a-308n at the top of the matrix 300 to the DATA I/O pad 302. The measured electrical resistance data is then analyzed with respect to DATA line numbers to identify and locate DATA line open defects.

For the DATA line (Dline) open measurements, the Dline to DATA pad (Dpad) resistance is sampled across the matrix 300 from the Dpad 302 to the individual Dlines 308a-308n, using a probe 309, 310 or other measurement device connected to the system controller 204. Each combination of Dline to Dpad may be measured. For instance, the first measurement might be from Dpad 302 to Dline 308a, the second measurement from Dpad 302 to Dline 308b, and so on.

In FIG. 3, the electrical current between certain Dlines and the Dpad is shown by arrows 312 and 314. The resistance measurements are then plotted with respect to the Dline number and the resistance to create a plotted graph 318. In this manner, the Dline 308a-308n to Dpad 302 measurements assist in identifying Dline electrical opens 320. For a Dline open defect, the collected and plotted data will tend to look like the example graph 318 in FIG. 3 where the high resistance spike locates the open Dline. The vertical line(s) in this plot are for the Dlines that had electrical opens. The plot graph 318 is merely an illustration of a representative scenario with increasing Dline resistance from left to right. This is primarily due to the increasing contribution of the bottom DATA bus's 304 sectional resistance from the matrix's 300 left side to the right side. Thus, an open defect 320 is identified by analyzing the plot data 318 and analyzing the data for unexpected spikes. For the matrix 300 of FIG. 3, the analysis of the plot data 318 shows that there is an open defect 320 at Dline 308b, as evidenced by the vertical spike in the plot data 318.

Figure 4:
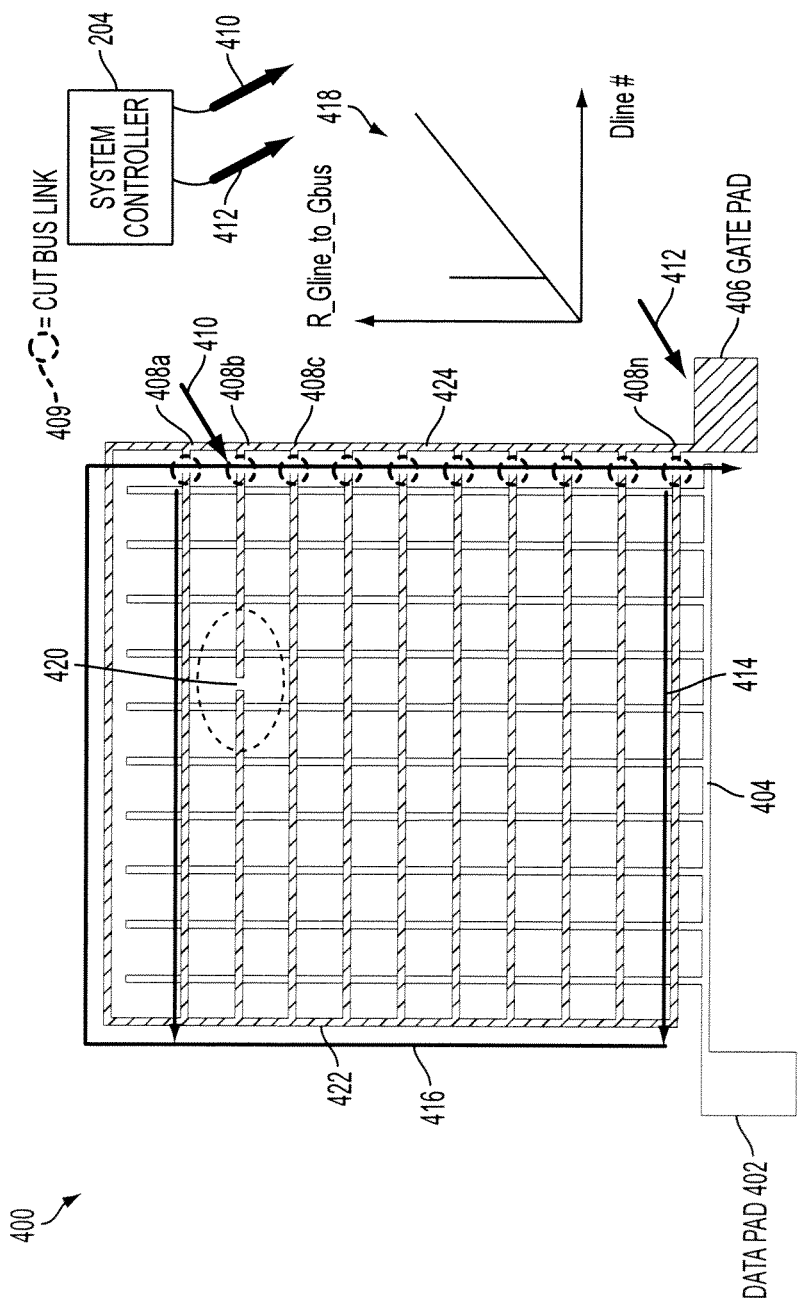
FIG. 4 illustrates how electrical open GATE line data collection measurements are performed for an array matrix.

Similarly, open GATE line (Gline) defect data (represented by horizontal lines in the matrix 400) is collected and analyzed as shown in FIG. 4. The I/O pad 402 at the lower left corner is the DATA I/O pad for a fixed electrical connection from the common data bus 404 to an external electrical return. Similarly, the I/O pad 406 at the lower right corner is the GATE I/O pad. Electrical resistance from the individual GATE lines 408a-408n on the right side of the matrix 400 to the GATE I/O pad 406 are measured. The measured electrical resistance data may then be analyzed with respect to GATE line numbers to identify GATE line open defects.

For the GATE line (Gline) measurements, the GATE bus links 409 are severed before any measurements are taken. Using a probe 410, 412 or other measurement device connected to the system controller 204, the Gline to GATE pad (Gpad) resistance is sampled across the matrix 400 from the Gpad 406 to the individual Glines 408a-408n. Each combination of Gline 408a-408n to Gpad 406 is measured. For instance, the first measurement might be from Gpad 406 to Gline 408a, the second measurement from Gpad 406 to Gline 408b, and so on. In FIG. 4, the electrical current between certain Glines and the Gpad 406 is shown by arrows 414 and 416. The resistance measurements are then plotted with respect to the Gline number and the resistance to create a plotted graph. In this manner, the Gline 408a-408n to Gpad 406 measurements assist in identifying Gline electrical opens. As with a Dline open defect, the collected and plotted Gline data will tend to look like the example graph 418 in FIG. 4 where the high resistance spike locates the open Dline. The plot graph 418 is merely an illustration of a representative detection scenario with increasing Dline resistance from left to right. Thus, an open defect 420 is identified by analyzing the resistance plot data with respect to Dline numbers. For the matrix 400 of FIG. 4, the analysis of the plot data in view of the expected output shows that there is an open at Gline 408b, as evidenced by the vertical spike in the plot data 418.

Identifying Intra-Layer Line Bridges

Figure 5:
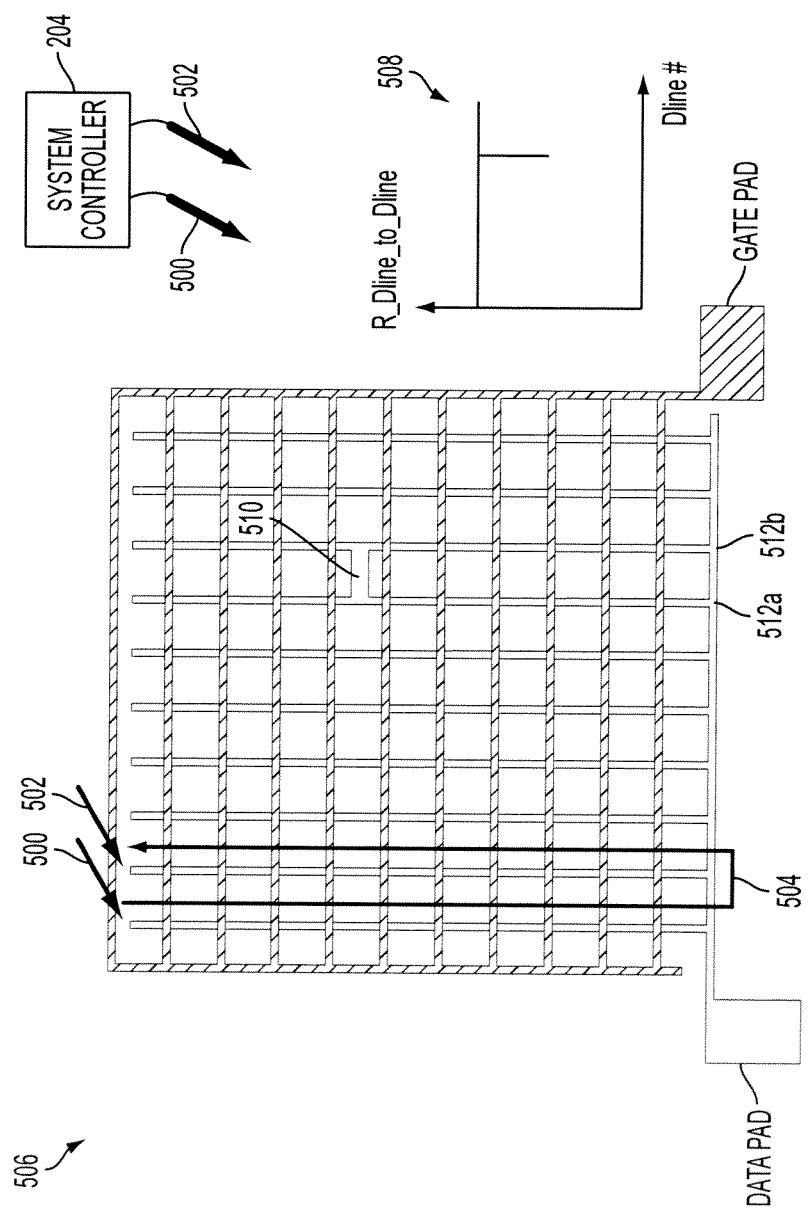
FIG. 5 illustrates how DATA and GATE line bridges are identified via resistance measurements.

Dline bridging is identified by the Dline to Dline probe measurements as illustrated in FIG. 5. In the case of Dline bridge detection, probes 500, 502 or other measuring devices such as those connected to the system controller 204 are placed at the end of separate Dlines. The path of electric current between probes 500, 502 is illustrated by arrow 504. The amount of resistance between the probes 500, 502 is measured and recorded. The process is repeated for every combination of Dlines. The recorded data is then plotted on a graph and analyzed to identify bridge defects. For a matrix 506 with no Dline bridges, one would expect a relatively flat resistance level between any two Dlines. However, as shown in graph 508, a bridge between two Dlines will show an abnormally low resistance due to the bridge. As shown in FIG. 5, the matrix 506 contains a bridge 510 between Dlines 512a and 512b, which is shown in the graph 508 as the vertical line perpendicular to the expected resistance.

For detecting GATE layer bridges, a similar arrangement as that used in FIG. 5 for the DATA layer is used, except that measurements are taken for Glines instead of Dlines.

Identifying Interlayer Shunts

Figure 6:
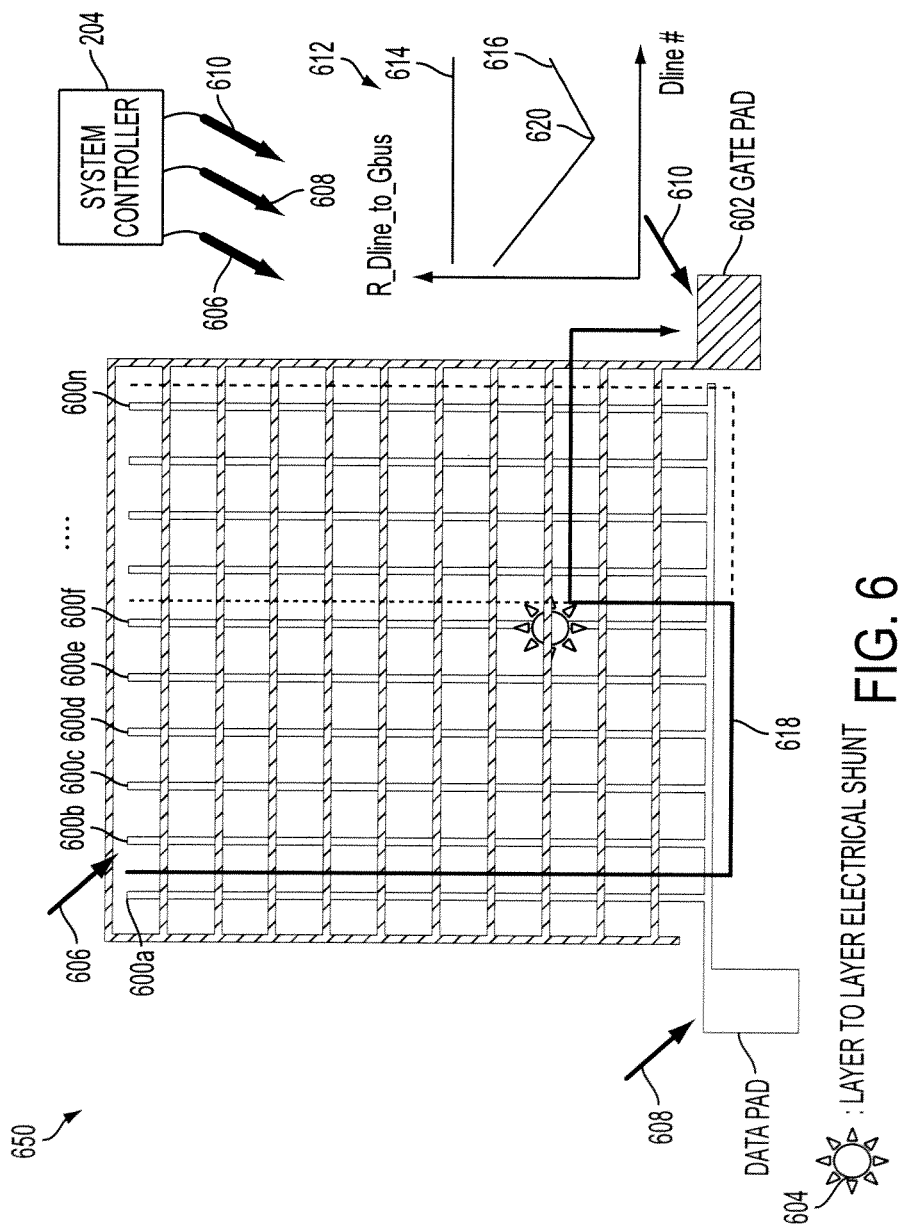
FIG. 6 illustrates how DATA line to GATE pad resistance measurements assist in identifying interlayer shunt defects.

In addition to measuring the Dline resistance to the Dpad which reveals the open Dline defects, much can be learned by collecting Dline to Gpad resistance data. FIG. 6 illustrates how Dline 600a-600n to Gpad 602 resistance measurements assist in identifying interlayer shunt defects 604. Using probes 606, 608, 610 or other measurement devices on matrix 650, such as those connected to the system controller 204, current is sent on each Dline 600a-600n, one at a time, from probe 606 to probe 608. Concurrently, the resistance of the current is measured at Gpad 602 with probe 610. The measured resistance data is then analyzed to identify any shunt defects. If there is no electrical shunt 604 on the matrix 650, then the measured resistance at the Gpad 602 should be constant, as shown by the line 614 on the Dline-to-Gpad graph 612. However, an electrical shunt 604 will cause the Gpad 602 to detect a variable amount of resistance from the Dline probe 606 due to the shunt 604 providing a path for the current 618 from the Dline 600a-600n to the Gpad 602. As illustrated by the Dline-to-Gpad data plot 612, the plotted resistance for a matrix 650 containing a shunt defect 604 will produce a "V" shaped plot. The lowest data point 620 of the "V" shaped data plot 616 pinpoints the location of the shunt defect 604. In FIG. 6, the shunt defect 604 is located on Dline 600f.

Alternatively, the shunt defect 604 of FIG. 6 could be identified using a differential data analysis technique which highlights the shunt defect location. With the differential data analysis technique, the resistance data is plotted after compensating for environmental factors such as initial line resistance. A differential data analysis data plot still produces a data set where the lowest resistance value (of the "V" shape) will identify the location of the shunt defect 604.

Figure 7B:
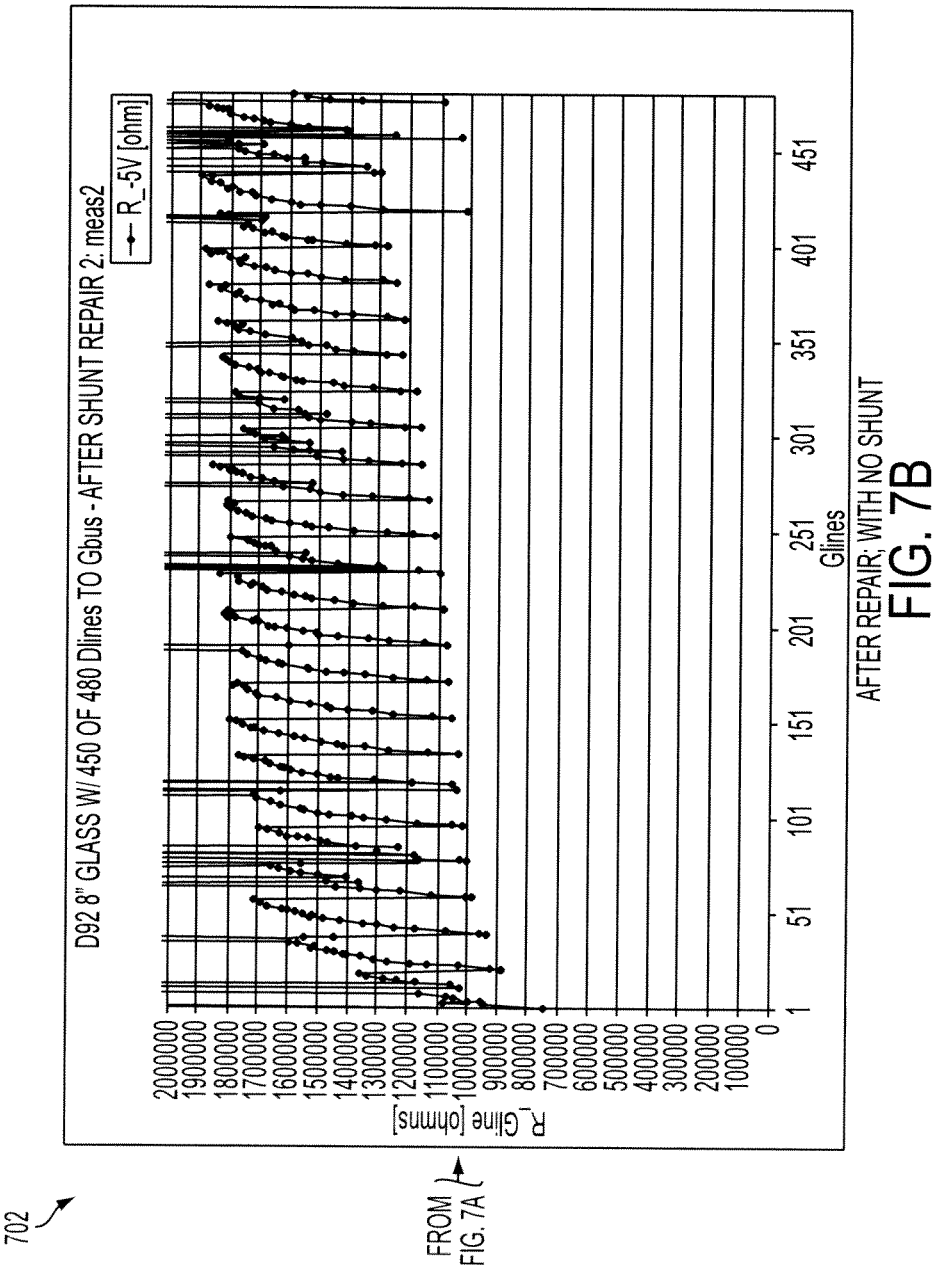

With respect to FIGS. 7a and 7b, the plotted data for a shunt defect (similar to shunt defect of 604 of FIG. 6) is shown before repair 700 and after repair 702 with a laser ablation tool.

Figure 8A:
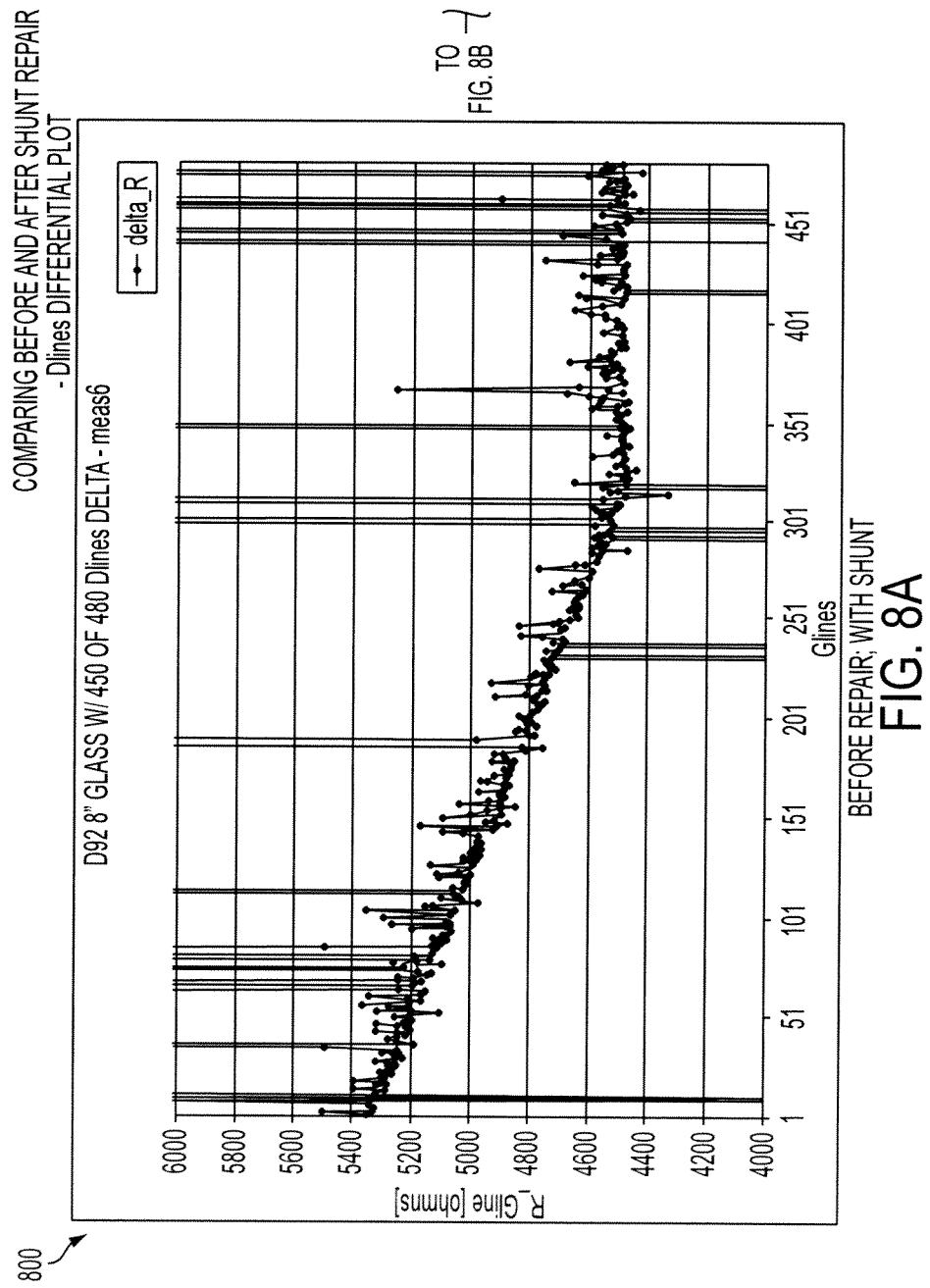
FIGS. 8a and 8b illustrate a data plot of the measured resistance for an array matrix both before and after a shunt repair is performed using a differential data analysis technique.
Figure 8B:
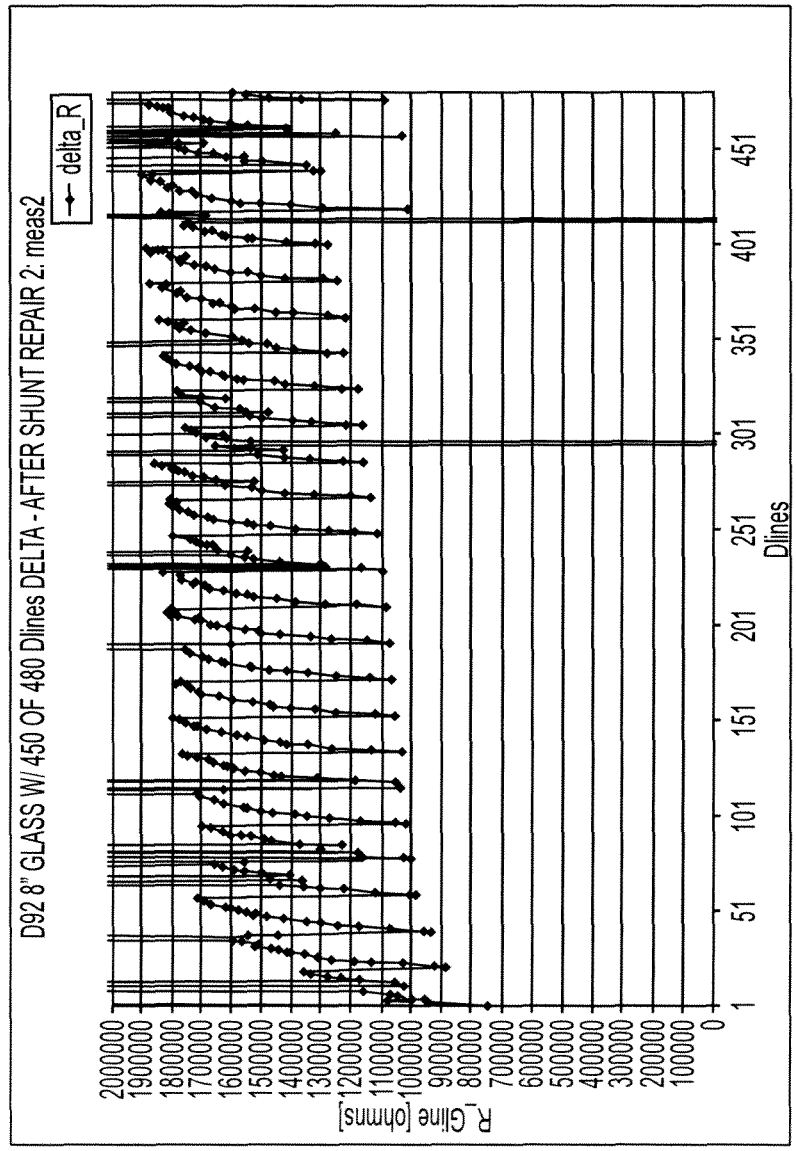

FIGS. 8a and 8b compare Dline differential plots of an array matrix containing a shunt defect both before repair 800 and after repair 802 with a laser ablation process. With the differential data analysis technique, the resistance data is plotted after compensating for environmental factors such as initial line resistance.

Figure 9:
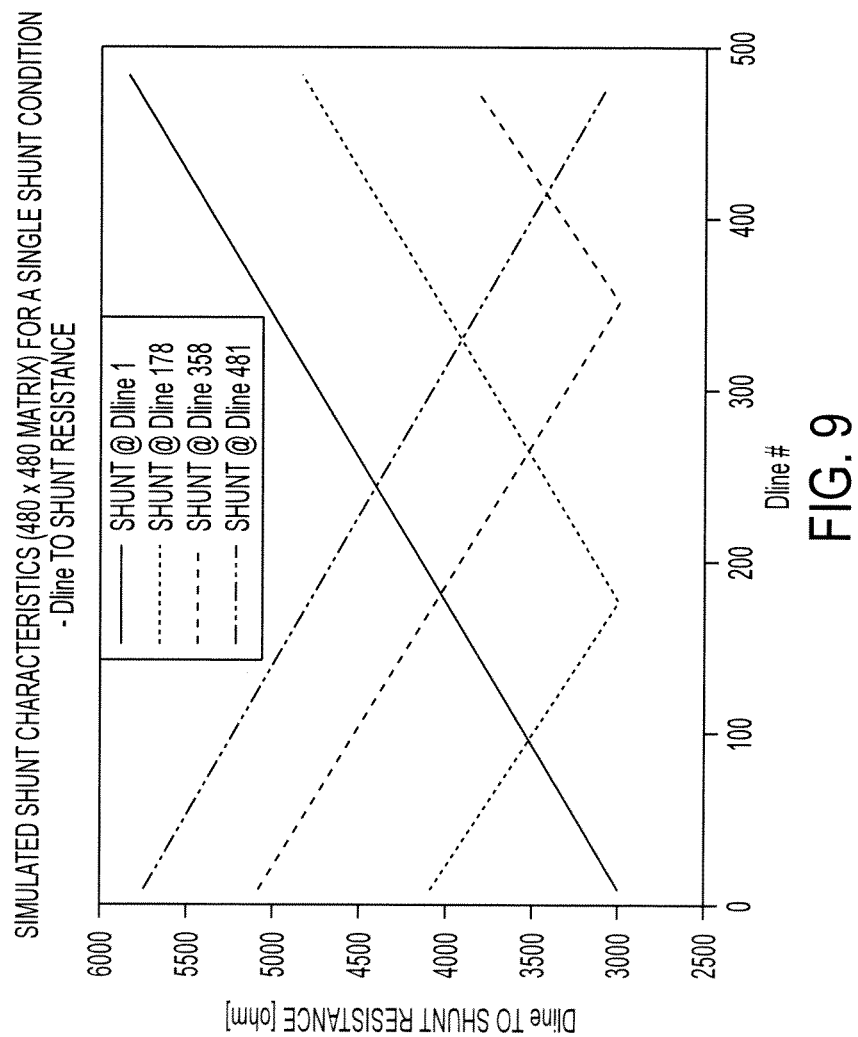
FIG. 9 shows a simulation of the measured electrical resistance on an array matrix containing shunt defects.

FIG. 9 simulates the Dline to Gpad resistance as a function of Dline position across an array from left to right. If a shunt defect is located on Dline 1, a positive slope linear dependence with position is demonstrated. If the shunt defect is located on Dline 481, a negative slope linear dependence with position results. If the shunt defect is not located at the array boundary (Dline 1 or Dline 481), the resulting curves are "V" shaped. The local plot minima represents the Dline which hosts the shunt defect. The absolute resistance value of the defective Dline can be used to calculate the exact cross point Gline to predict where the shunt defect occurs. However, it may be easier to just visually inspect and run down this defective Dline and locate and isolate the shunt defect.

Figure 10:
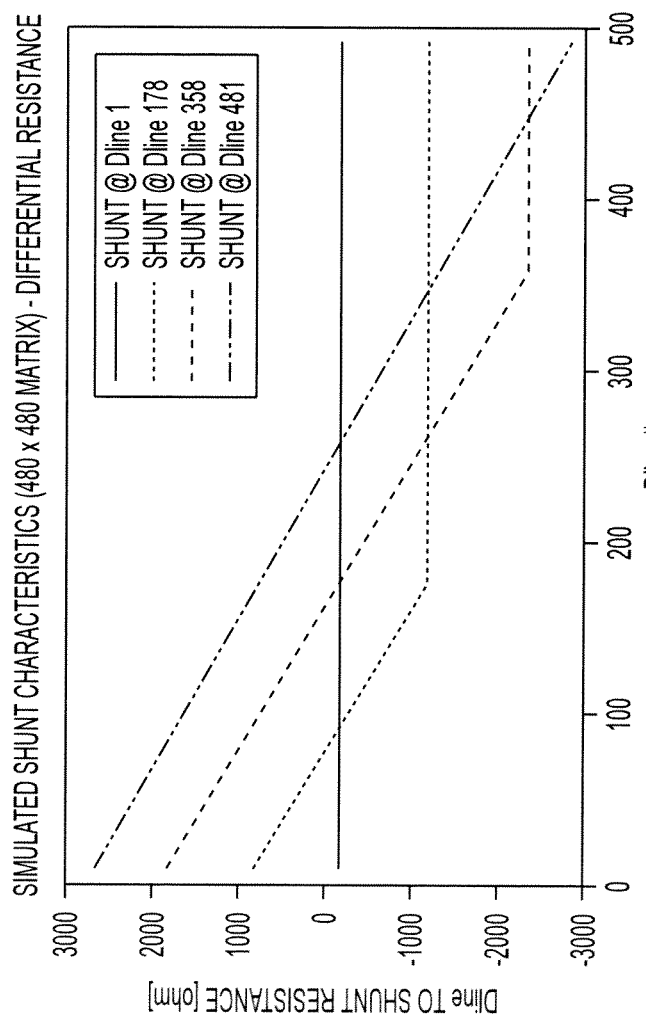
FIG. 10 shows a simulation of the differential resistance measured on an array matrix containing single shunt defects.

FIG. 10 simulates the differential resistance of Dline to Gpad to Dline to Dpad vs. Dline # characteristics for single shunt conditions. The corresponding Dline to Gpad vs. Dline # characteristics are illustrated in FIG. 9. The characteristic slope to horizontal "knee" 1000 locates the measured resistance minima more apparently which assists in identifying the Dline impacted by the single shunt defect.

Figure 11:
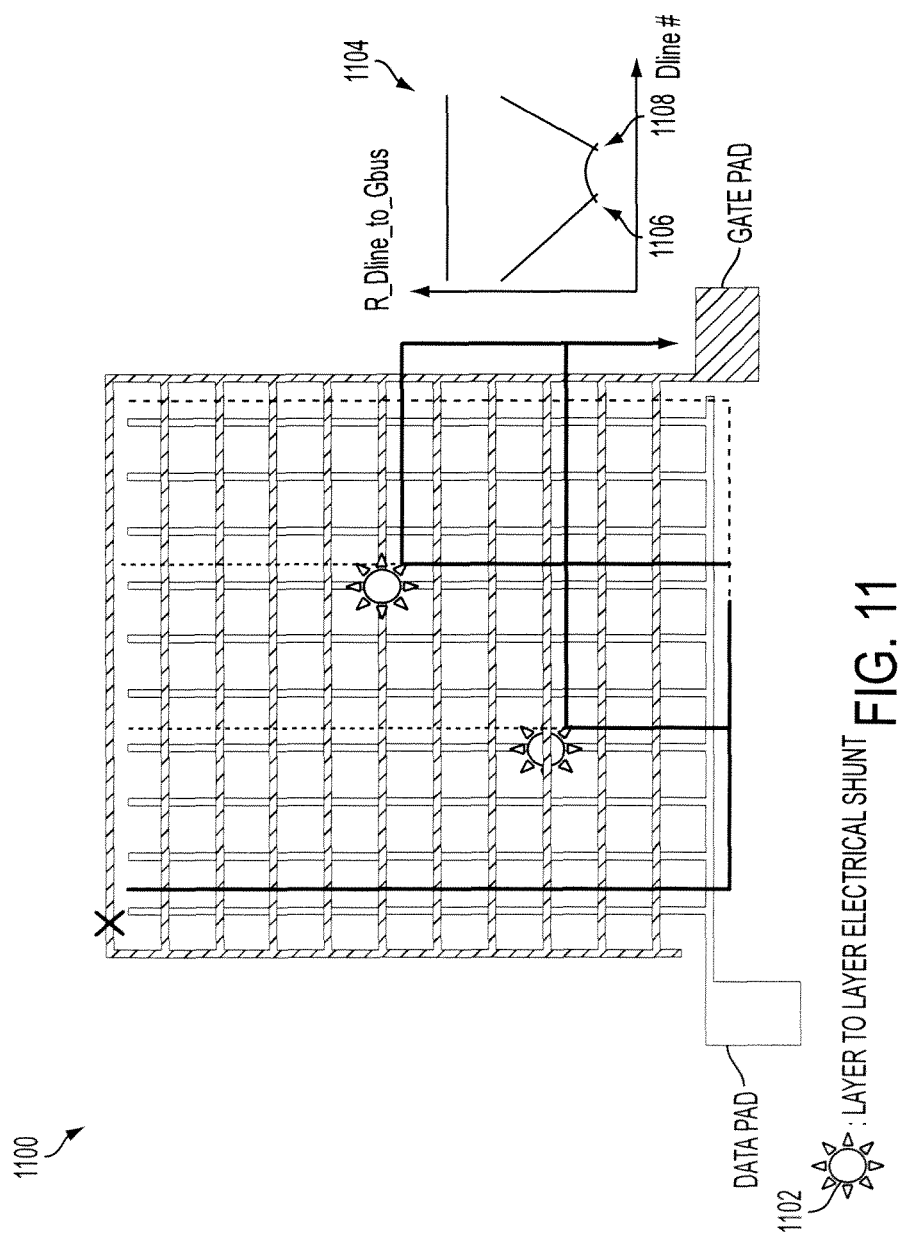
FIG. 11 illustrates an array matrix with multiple shunt defects.

With respect to FIG. 11, a matrix 1100 with multiple shunt defects 1102 is shown. Resistance measurements are taken as shown in FIG. 6. However, the resulting data plot 1104 will show two data minima 1106, 1108 instead of one. Each of these minima 1106, 1108 corresponds to a shunt defect 1102 on the electrical matrix 1100. This concept can be extrapolated to any number of shunt defects on a matrix. For instance, if a matrix contains three shunt defects on different Dlines, then there will be three different minima on the resistance data plot.

Figure 12:
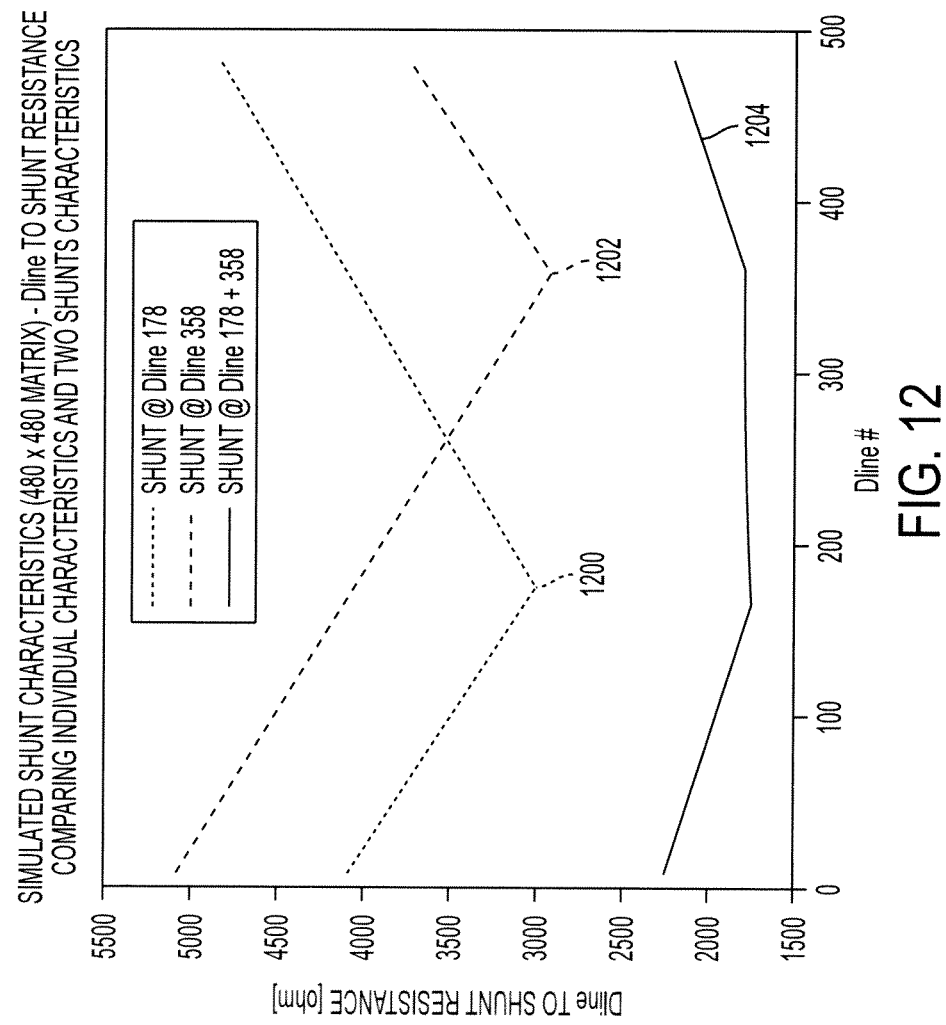
FIG. 12 illustrates a data plot showing multiple shunt defects on the same array matrix.
Figure 13:
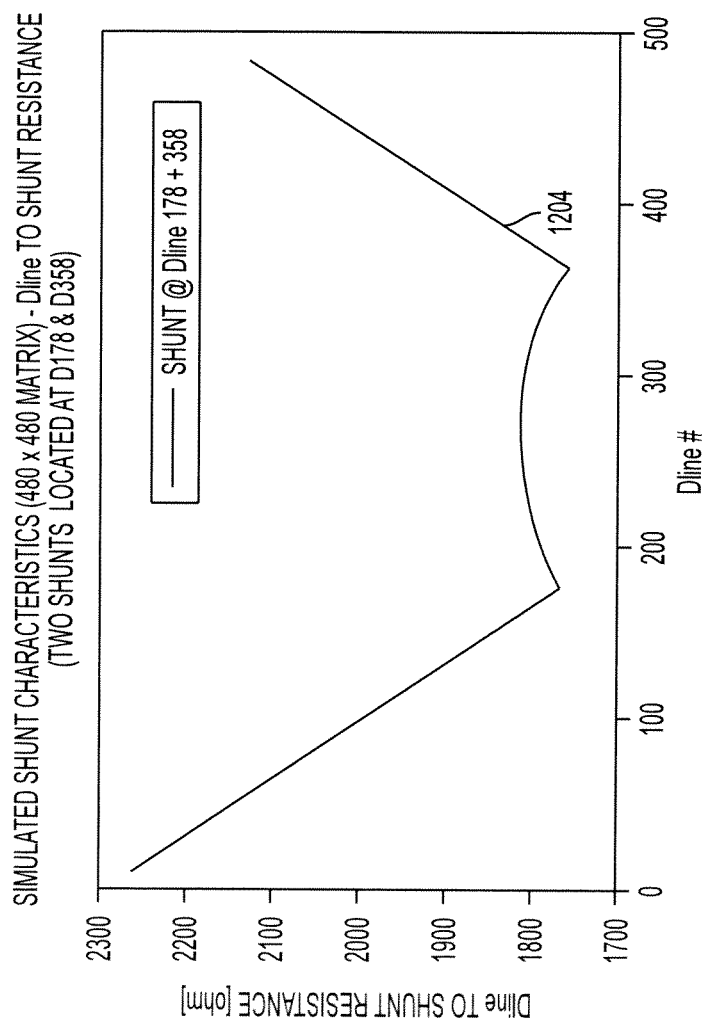
FIG. 13 shows the data plot of FIG. 12 rescaled for better visualization of the multiple shunt defect data.

FIG. 12 illustrates multiple shunt defects on the same array. For simplicity, two shunt defects are illustrated. Line 1200 is an individual singular shunt defect located at Dline 170. Line 1202 is an individual singular shunt defect on Dline 358. However, when both shunt defects 1200 and 1202 occur on the same array, dual shunt curve 1204 will be produced by the resistance measurements. The dual shunt curve 1204 has two local minimas, which are signatures for the shunt defect host lines Dline 178 and Dline 358. The dual shunt curve 1204 has been rescaled along the Y axis in FIG. 13 for better visualization.

Figure 14:
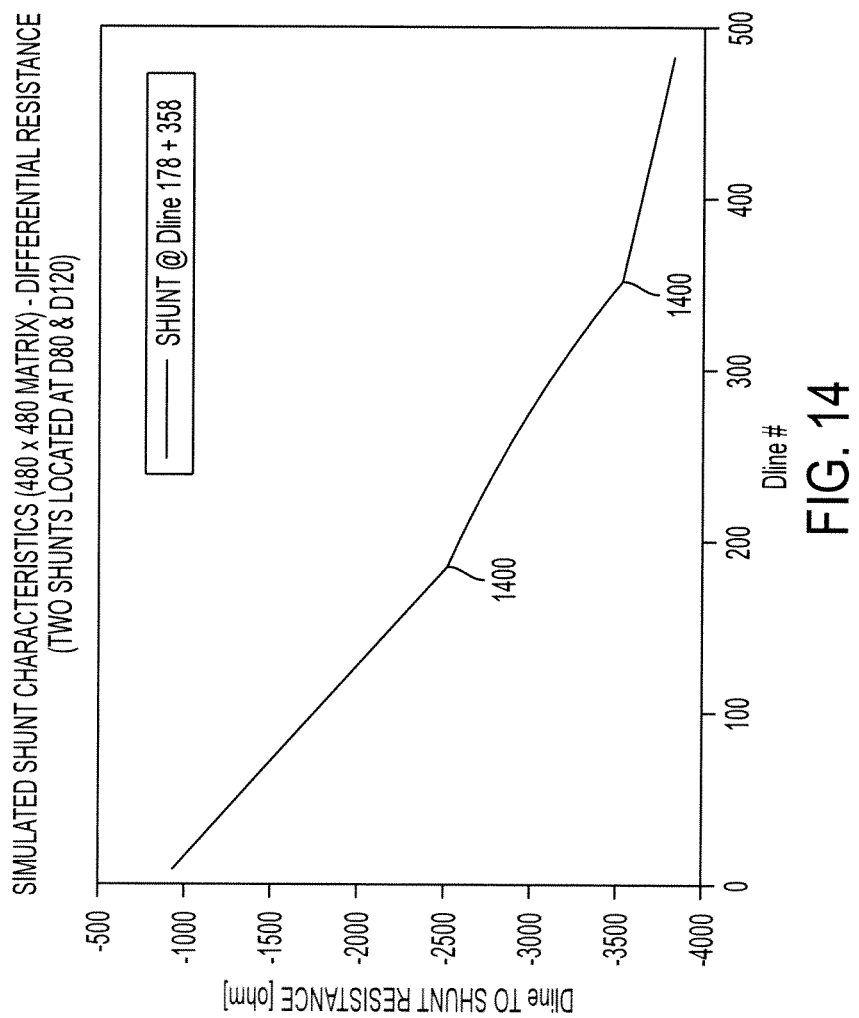
FIG. 14 shows a simulation of the differential resistance measured on an array matrix containing multiple simultaneous shunt defects.

FIG. 14 simulates the differential resistance of Dline to Gpad to Dline to Dpad vs. Dline # characteristics for two simultaneous shunts (shunts at Dline 178 and Dline 358). The characteristic "V" shapes are merged and the local minimas 1400 identify the Dlines impacted by the two shunt defects.

Correcting Identified Defects

The exemplary embodiments also comprise a method and system for dynamically reconfiguring a die (or chip) design to correct for fabrication defects, such as the open-line, bridge and shunt defects identified and/or identified above. This approach takes advantage of the on-demand printing flexibility of a digital lithography system. Chip fabrication defects are identified during the fabrication process and these faults are intelligently interpreted to redefine the chip circuitry. The chip defect type (i.e., intralayer open, intralayer bridge or interlayer shunt), location, process state and other pertinent information is dynamically input into the system so that the system can dynamically modify and re-route the chip circuitry. The new reconfigured circuitry results in modified mask layers which are then downloaded onto the digital lithography system for the printing of subsequent mask layer for the defective substrate.

The exemplary embodiment described requires no additional equipment or layers for the repairs, which call only for modifications of the specifications for layers that are already part of the circuit design. Although the current embodiment and emphasis is on POE arrays, this methodology can be applied to other devices as well. Trace opens and VIA opens in PCB and other low temperature polysilicon application manufacturing can also benefit by using the exemplary embodiment. These techniques can be used to fix memory arrays, FPD arrays etc. as well.

Figure 15:
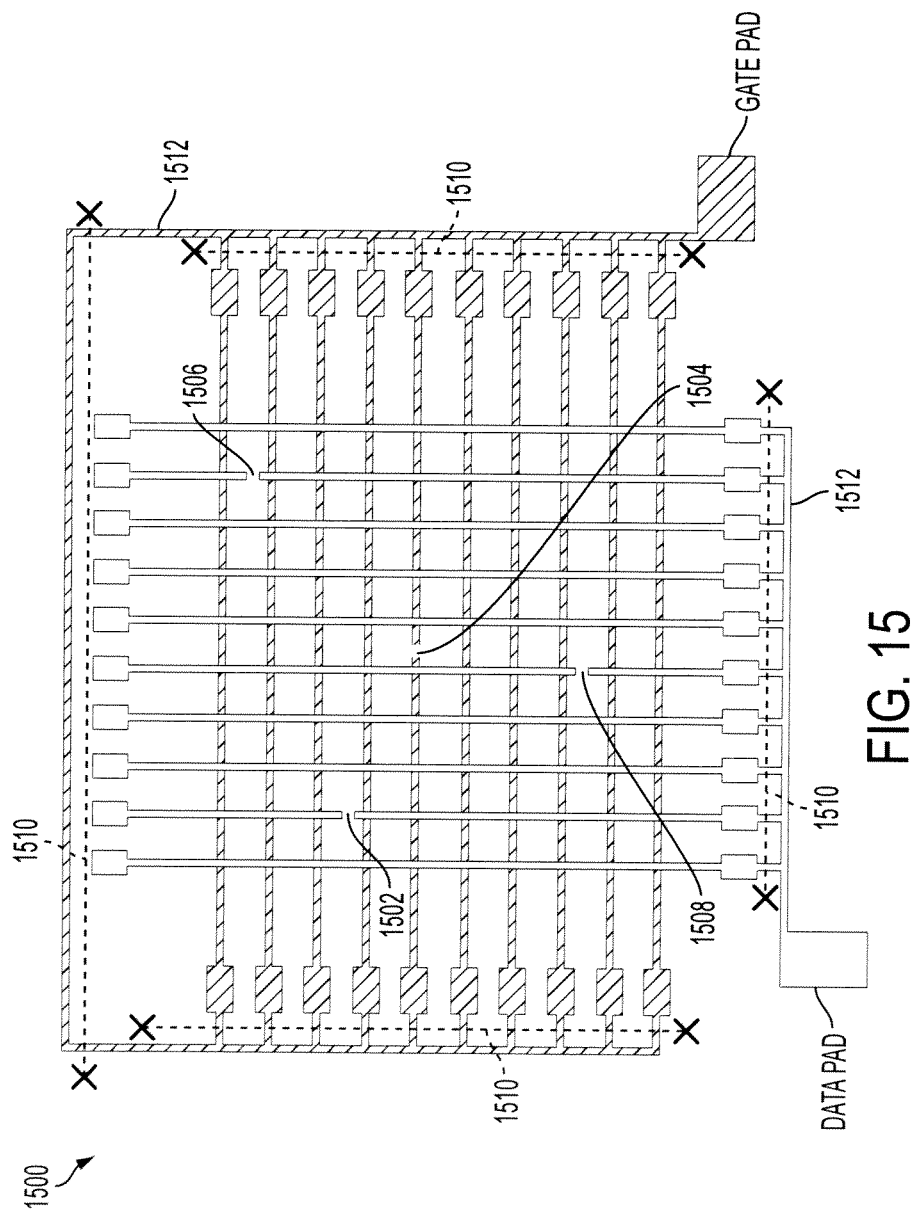
FIG. 15 illustrates a printed organic electronics array with identified open line defects.

Referring now to FIG. 15, a POE array 1500 with identified open defects 1502, 1504, 1506, 1508 is illustrated. The open defects are identified as shown above with respect to FIG. 3 and FIG. 4. The POE array 1500 contains a set of cut lines 1510 that must be severed from the array 1500 in order to isolate the DATA and Glines from the peripheral buses 1512.

Figure 16:
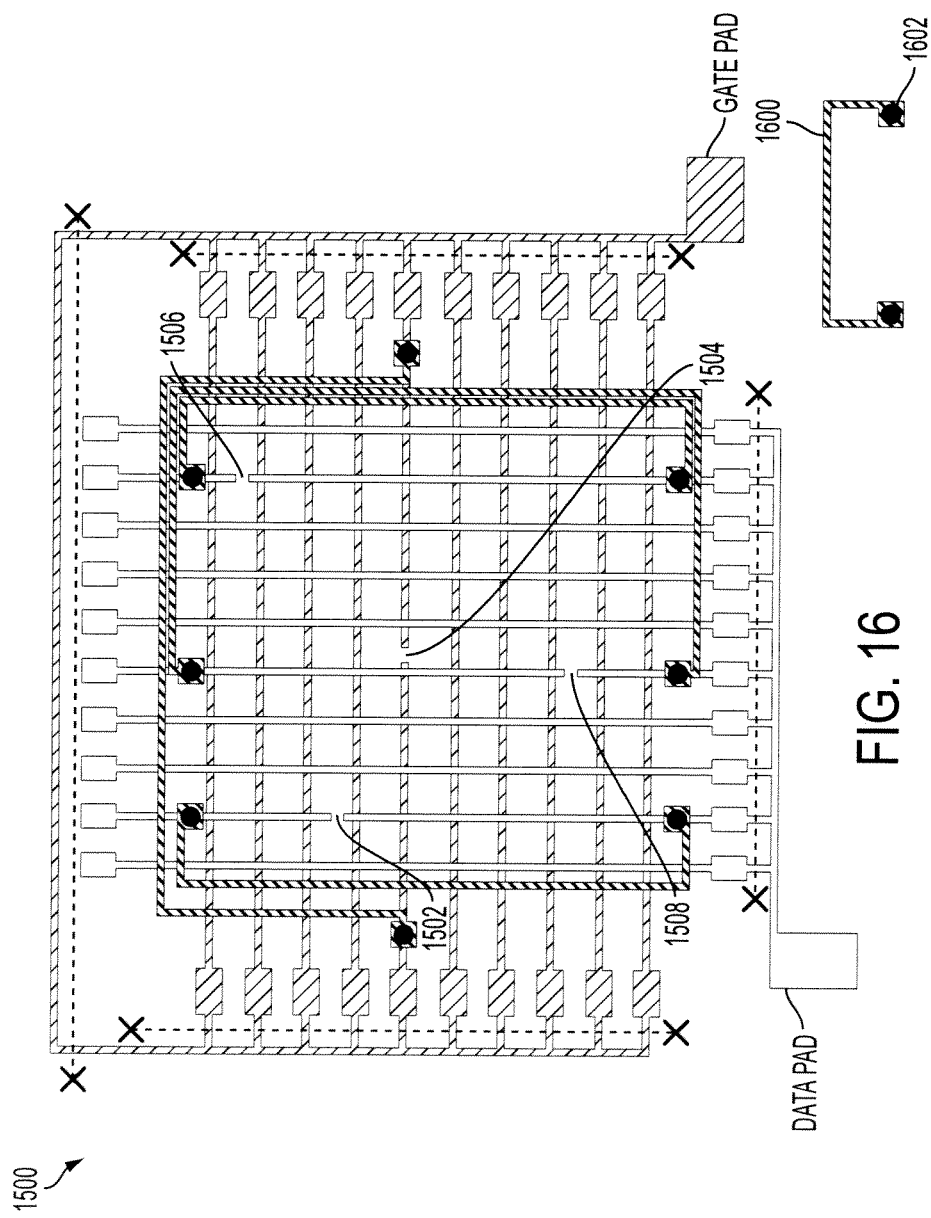
FIG. 16 illustrates the corrected open line defects of FIG. 15 using a VIA layer and a mushroom metal layer.

With respect to FIG. 16, the POE array 1500 of FIG. 15 is depicted after mushroom metal layers 1600 are added with a VIA layer 1602 to the array 1500 in order to correct open-line defects 1502, 1504, 1506, 1508. As described with respect to FIG. 2, the layer definition module 206 creates a layer design that includes a mushroom metal layer 1600 and VIA layer 1602 for application on the POE array 1500. The new layer definition is designed such that open defects such as 1502, 1504, 1506, 1508 are corrected by connecting each side opposite the open defect to form an uninterrupted GATE or DATA line. The layer definition module 206 creates the modified layer design such that the new layers 1600, 1602 do not overlap. The mushroom metal layer 1600 and VIA layer 1602 design reconfiguration are then downloaded to a digital lithography printer (FIG. 2, item 208) for pattern definition for a POE circuit.

Figure 17:
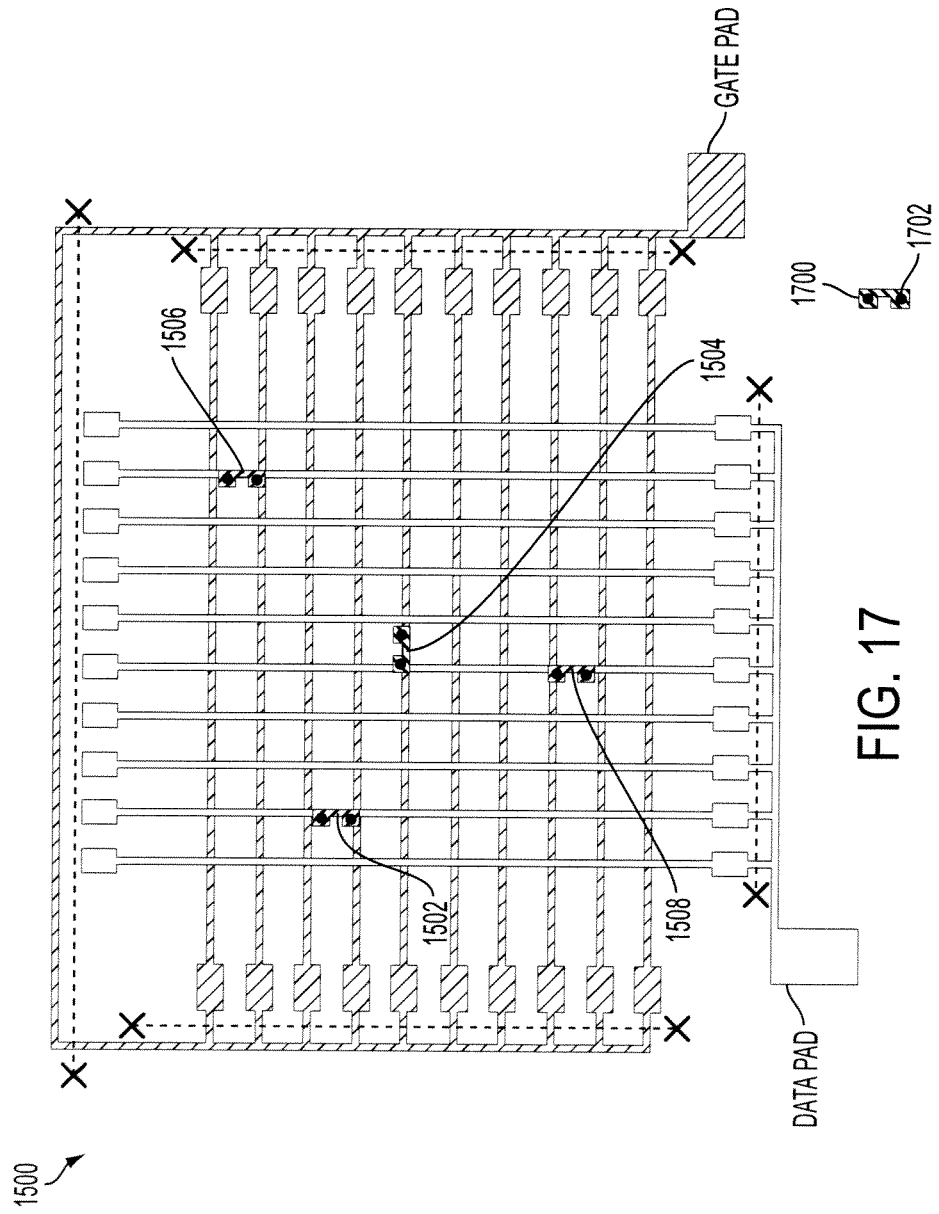
FIG. 17 illustrates an alternative solution for the correction of open line defects of FIG. 15 using localized line bridging.

With respect to FIG. 17, the POE array 1500 of FIG. 15 is depicted with an alternate solution for the open-line defects 1502, 1504, 1506, 1508. This alternative solution utilizes a mushroom metal layer 1700 and a VIA layer 1702 with localized line bridging. This technique is useful if a pixel design rule dictates adequate real estate space on the array 1500 to implement such a fix. The mushroom metal and VIA layer design reconfiguration is then downloaded to a digital lithography printer for pattern definition, as shown in FIG. 19.

Figure 18A:
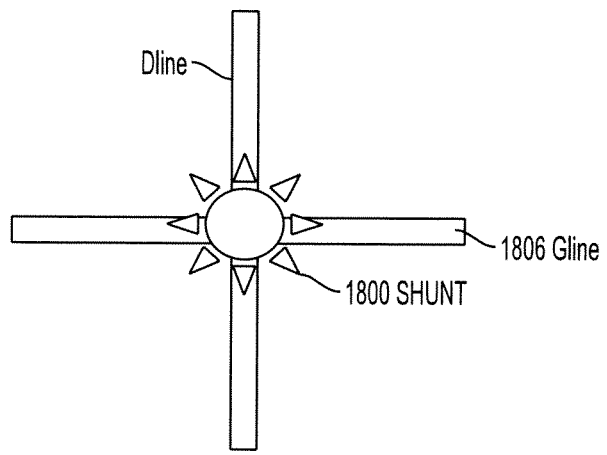
FIG. 18a illustrates a close-up view of an interlayer shunt defect.
Figure 18B:
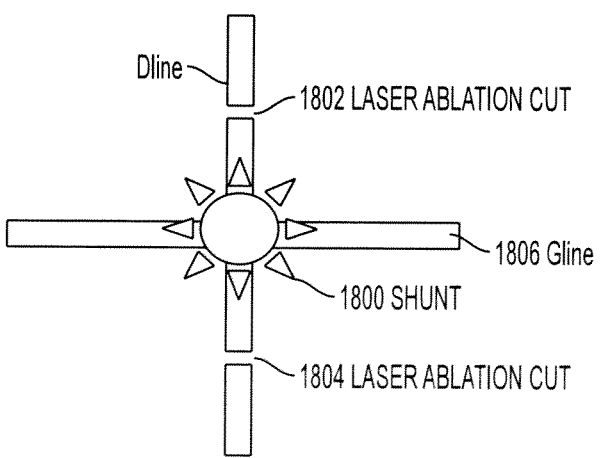
FIG. 18b illustrates the correction of the interlayer shunt defect of FIG. 18a using a laser ablation method.

With respect to FIGS. 18a and 18b, a close-up view of shunt defect 1800 is shown. After the shunt defect 1800 is identified (as shown in FIG. 18a), a laser ablation method is used to electrically isolate the shunt defect 1800 (as shown in FIG. 18b). In this case, laser cuts 1802, 1804 above and below the intersecting Gline 1806 are sufficient. After the laser ablation cuts 1802, 1804 are made, the shunt defect 1800 then degenerates to a Dline open since the line was cut near the shunt defect 1800. At this stage, the new Dline open can be corrected the same as the open defects above in FIGS. 16 and 17.

Figure 19:
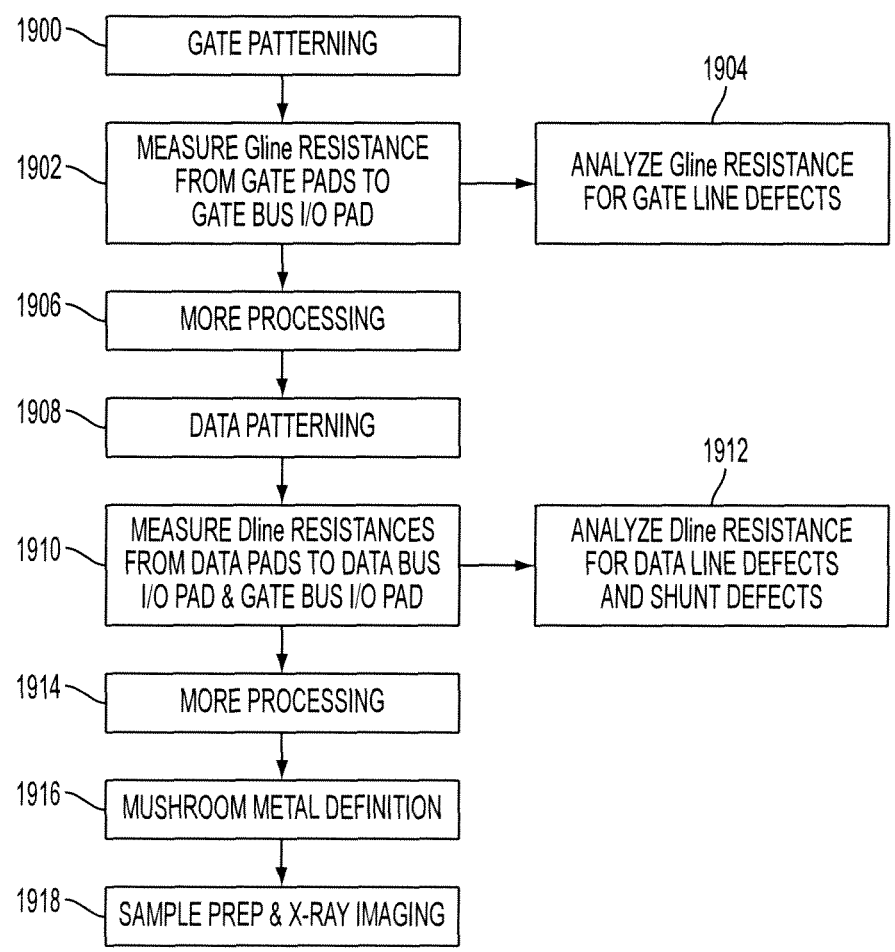
FIG. 19 illustrates data measurement points for GATE and DATA layers in an example TFT fabrication in-process flow.

FIG. 19 is a flow chart illustrating the data measurement points 1902, 1904, 1910, 1912 for the GATE and DATA (aka S/D) layers in an example TFT fabrication in-process flow. The process can be performed by the in-process defect detection and correction system 200 of FIG. 2.

At step 1900, a GATE pattern is formed on a substrate via a printing process utilizing digital lithography based design.

At step 1902, the system controller (FIG. 2, item 204) measures the Gline resistance from the gate pads to the Gate bus I/O pad as shown in FIG. 4. The exemplary embodiment enables the improved strategy of detecting Gline faults because there are GATE level buses on opposing sides of the Glines (as shown by items 422 and 424 of FIG. 4). This facilitates an optimized dual feed GATE dielectric anodization scheme. It also helps to provide a better ground plane for shunt detection.

At step 1904, the Gline resistance measured in step 1902 is plotted and analyzed by the system controller (FIG. 2, item 204) as shown in FIGS. 4 and 5. The resulting defect data (FIG. 2, item 214) is then sent to the layer definition module (FIG. 2, item 206) and laser ablation tool (FIG. 2, item 207) for defect correction. Any open or bridge defects detected here will be corrected in step 1916.

At step 1906, additional TFT fabrication processing is performed.

At step 1908, a DATA pattern is formed on the substrate via a printing process utilizing digital lithography based design.

At step 1910, the Dline resistance from the DATA pads to the DATA bus I/O pad and GATE bus I/O pad is measured as shown in FIGS. 3, 5, 6 and 11. The measuring process is similar to that of step 1902.

At step 1912, the measured resistance from step 1910 is plotted and analyzed (in a manner similar to step 1904) in order to detect Dline defects and shunt defects. Any defects detected here will be corrected in step 1916.

At step 1914, any necessary additional TFT fabrication processing is performed.

At step 1916, the defect knowledge gained in steps 1904 and 1912 by the system controller (FIG. 2, item 204) is fed forward to defect processing modules (FIG. 2, items 206, 207) for re-routing the defective lines around the POE array matrix using the yet un-processed VIA and Mushroom Metal layers. Open-line defects are repaired by applying VIA and mushroom metal layers around the POE array matrix to bridge the electrical signal path that was severed because of the open defect. FIG. 16 illustrates such a design re-configuration using these new layers which are then downloaded to a maskless digital lithography printer (FIG. 2, item 208) for patterning. An alternate embodiment can perform localized "spot" bridge repair of open line defects inside the POE array matrix using the VIA and mushroom metal layers, if design rules permit. The alternate embodiment is illustrated in FIG. 17 where the line bridge repair is localized within the matrix array. This technique is useful if the pixel design rule dictates adequate real estate space to implement such a fix. For bridge and shunt defects, a laser ablation process (or any other suitable alternative) is used to isolate the defect. In the case of a shunt defect, the laser ablation process will change the shunt defect into an open line defect (as shown in FIG. 18b), which can then be repaired with the VIA and mushroom metal layer definitions as described above. Since this is a maskless lithography process, no new mask cost is associated with these mask layer updates. As a result, near perfect POE imagers can then be realized.

At step 1918, the fabrication of the TFT POE array matrix is completed. If desired, the fabricated product can then be tested using conventional techniques such as x-ray imaging.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for in-process yield evaluation in an array type of device, comprising:
    measuring an electrical property between individual GATE lines, DATA lines, a DATA bus I/O pad, and a GATE bus I/O pad; and
    analyzing the measured electrical property to identify interlayer shunt defects;
wherein interlayer shunt defects are identified through a process including:
    measuring electrical resistance between individual DATA lines and the GATE bus I/O pad to obtain electrical resistance data, and
    analyzing the measured electrical resistance data to identify interlayer shunt defects.

2. The method of claim 1, wherein the electrical property is electrical resistance.

3. The method of claim 2, wherein an identified location, and process state is sent to a defect correction device.

4. The method of claim 2, wherein the defects are identified on one of:
    printed organic electronics,
    printed circuit boards,
    active matrix displays,
    passive matrix displays, and
    memory arrays.

5. The method of claim 2, wherein analysis of the measured electrical resistance data uses a differential data analysis technique.

6. The method of claim 2, wherein the electrical resistance is measured by a switching matrix which is capable of switching the tension of a testing instrument to each one of the lines, one at a time.

7. The method of claim 1, wherein the electrical property is electrical capacitance.

8. A method for in-process yield evaluation in an array type of device, comprising:
    measuring an electrical property between individual GATE lines, DATA lines, a DATA bus I/O pad, and a GATE bus I/O pad; and
    analyzing the measured electrical property to identify at least one of the following:
        GATE line open defects,
        GATE line bridge defects,
        DATA line open defects,
        DATA line bridge defects, and
        interlayer shunt defects;
wherein the electrical property is electrical resistance;
wherein GATE line open defects are identified through a process including:
    measuring electrical resistance between individual GATE lines and a GATE bus I/O pad, and
    analyzing the measured electrical resistance data to identify GATE line open defects;
wherein the GATE line bridge defects are identified through a process including:
    measuring electrical resistance between individual GATE lines, and
    analyzing the measured electrical resistance data to identify GATE line bridge defects;
wherein DATA line open defects are identified through a process including:
    measuring electrical resistance between individual DATA lines and the DATA bus I/O pad, and
    analyzing the measured electrical resistance data to identify DATA line open defects;
wherein the DATA line bridge defects are identified through a process including:
    measuring electrical resistance between individual DATA lines, and
    analyzing the measured electrical resistance data to identify DATA line bridge defects; and
wherein interlayer shunt defects are identified through a process including:
    measuring electrical resistance between individual DATA lines and the GATE bus I/O pad, and analyzing the measured electrical resistance data to identify interlayer shunt defects.

9. The method of claim 8, wherein at least one of the following is performed:
electrical resistance is measured between every individual GATE line and the GATE bus I/O pad;
electrical resistance is measured between every combination of GATE lines;
electrical resistance is measured between every individual DATA line and the DATA bus I/O pad;
electrical resistance is measured between every combination of DATA lines; and
electrical resistance is measured between every individual DATA line and the GATE I/O pad.

10. The method of claim 8, wherein the analyzing the measured electrical resistance data to identify GATE line open defects comprises:
creating a data plot with the measured electrical resistance data with respect to the GATE line number measured;
identifying any irregular data spikes as an open line defect at a corresponding GATE line.

11. The method of claim 8, wherein the analyzing the measured electrical resistance data to identify GATE line bridge defects comprises:
creating a data plot with the measured electrical resistance data with respect to the GATE line number measured;
identifying any irregular data spikes as a bridge line defect at a corresponding GATE line.

12. The method of claim 8, wherein the analyzing the measured electrical resistance data to identify DATA line open defects comprises:
creating a data plot with the measured electrical resistance data with respect to the DATA line number measured;
identifying any irregular data spikes as an open line defect at a corresponding DATA line.

13. The method of claim 8, wherein the analyzing the measured electrical resistance data to identify DATA line bridge defects comprises:
creating a data plot with the measured electrical resistance data with respect to the DATA line number measured;
identifying any irregular data spikes as a bridge line defect at a corresponding DATA line.

14. The method of claim 8, wherein the analyzing the measured electrical resistance data to identify interlayer shunt defects comprises:
creating a data plot with the measured electrical resistance data with respect to the DATA line number measured;
identifying any local minima as a shunt defect at a corresponding DATA line.

15. A method for in-process correction of defects in an array type of substrate, comprising:
obtaining (i) identified defects types, including GATE line open defects, GATE line bridge defects, DATA line open defects, DATA line bridge defects, and interlayer shunt defects, (ii) locations, and (iii) process state by a system controller;
receiving by a mushroom metal and VIA layer definition module from the system controller, the identified defect types, locations, and process state;
dynamically reconfiguring a die or chip design to account for defects on the substrate based at least partially on the received defect types, locations, and process state for a printing by a digital lithography printer.

16. The method of claim 15, further comprising:
downloading the reconfigured die or chip design onto a digital lithography system for the printing of a subsequent mask layer for the defective substrate.

17. The method of claim 15, wherein the reconfigured design includes at least one of the following:
a mushroom metal layer, and
a VIA layer.

18. The method of claim 15, further comprising:
correcting line bridge and interlayer shunt defects with laser ablation.

19. The method of claim 15, further comprising:
correcting any open line defects created by the correction of line bridge and interlayer shunt defects with laser ablation with at least one of the following:
a mushroom metal layer, and
a VIA layer.

20. The method of claim 17, wherein the reconfigured design utilizes localized line bridging.

21. The method of claim 20, further comprising:
receiving identified defect types, defect locations, and process state; and
dynamically reconfiguring a die or chip design to account for defects on the substrate based at least partially on the received defect types, defect locations, and process state.

22. A system for in-process yield evaluation for an array type of device, comprising:
a system controller; and
an electrical measurement device, operatively connected to the system controller;
wherein the electrical measurement device measures an electrical property between individual GATE lines, DATA lines, a DATA bus I/O pad, and a GATE bus I/O pad on the array type of device;
wherein the system controller analyzes the measured electrical property to identify
interlayer shunt defects;
wherein the electrical measurement device measures electrical resistance between individual DATA lines and the GATE bus I/O pad to obtain electrical resistance data, and
wherein the system controller analyzes the measured electrical resistance data to identify interlayer shunt defects.

23. The system of claim 22, wherein the electrical property is electrical resistance.

24. The system of claim 22, wherein the electrical property is electrical capacitance.

25. A system for in-process yield evaluation for an array type of device, comprising:
a system controller; and
an electrical measurement device, operatively connected to the system controller;
wherein the electrical measurement device measures an electrical property between individual GATE lines, DATA lines, a DATA bus I/O pad, and a GATE bus I/O pad on the array type of device; and
wherein the system controller analyzes the measured electrical property to identify at least one of the following on the array type of device;
GATE line open defects,
GATE line bridge defects,
DATA line open defects,
DATA line bridge defects, and
interlayer shunt defects;
wherein the electrical property is electrical resistance;
wherein the system controller, operatively connected to the electrical
measurement device, detects GATE line open defects through a process including:

measuring electrical resistance between individual GATE lines and a GATE bus I/O pad, and analyzing the measured electrical resistance data to identify GATE line open defects;

wherein the GATE line bridge defects are identified through a process including:

measuring electrical resistance between individual GATE lines, and analyzing the measured electrical resistance data to identify GATE line bridge defects;

wherein DATA line open defects are identified through a process including:

measuring electrical resistance between individual DATA lines and the DATA bus I/O pad, and analyzing the measured electrical resistance data to identify DATA line open defects;

wherein the DATA line bridge defects are identified through a process including:

measuring electrical resistance between individual DATA lines, and analyzing the measured electrical resistance data to identify DATA line bridge defects; and wherein interlayer shunt defects are identified through a process including:

measuring electrical resistance between individual DATA lines and the GATE bus I/O pad, and analyzing the measured electrical resistance data to identify interlayer shunt defects.

26. A system for in-process correction of defects in an array type of substrate, comprising:

a system controller configured to obtain (i) identified defects types, including GATE line open defects, GATE line bridge defects, DATA line open defects, DATA line bridge defects, and interlayer shunt defects, (ii) locations, and (iii) process state;

a mushroom metal and VIA layer definition module; and a digital lithography printer;

wherein the mushroom metal and VIA layer definition module receives the defect data from the system controller, where the defect data comprises:

identified defect types, defect locations, and a process state; and wherein the mushroom metal and via layer definition module dynamically reconfigures a die or chip design to account for defects on the substrate based at least partially on the received defect types, locations, and process state.

27. The system of claim 26, further comprising a laser ablation tool operational to correct shunt defects identified by the system controller.

28. The system of claim 26, further comprising:

downloading the reconfigured die or chip design onto a digital lithography system for the printing of a subsequent mask layer for the defective substrate.

29. A method for in-process yield evaluation in an array type of device, comprising:

measuring an electrical property between individual GATE lines, DATA lines, a DATA bus I/O pad, and a GATE bus I/O pad; and analyzing the measured electrical property to identify at least one of the following:

GATE line open defects, and

DATA line open defects;

wherein GATE line open defects are identified through a process including:

measuring electrical resistance between individual GATE lines and a GATE bus I/O pad, and analyzing the measured electrical resistance data to identify GATE line open defects;

wherein DATA line open defects are identified through a process including:

measuring electrical resistance between individual DATA lines and the DATA bus I/O pad, and analyzing the measured electrical resistance data to identify DATA line open defects.

30. A system for in-process yield evaluation for an array type of device, comprising:

a system controller; and an electrical measurement device, operatively connected to the system controller;

wherein the electrical measurement device measures an electrical property between individual GATE lines, DATA lines, a DATA bus I/O pad, and a GATE bus I/O pad on the array type of device;

wherein the system controller analyzes the measured electrical property to identify at least one of the following on the array type of device:

GATE line open defects, and

DATA line open defects;

wherein GATE line open defects are identified through a process including:

measuring electrical resistance between individual GATE lines and a GATE bus I/O pad, and analyzing the measured electrical resistance data to identify GATE line open defects; and wherein DATA line open defects are identified through a process including:

measuring electrical resistance between individual DATA lines and the DATA bus I/O pad, and analyzing the measured electrical resistance data to identify DATA line open defects.

* * * * *